(12) United States Patent
Yoshimura et al.

(10) Patent No.: US 9,711,686 B2
(45) Date of Patent: Jul. 18, 2017

(54) LIGHTING DEVICE WITH PLURAL FLUORESCENT MATERIALS

(71) Applicant: SHARP KABUSHIKI KAISHA, Osaka-shi, Osaka (JP)

(72) Inventors: Kenichi Yoshimura, Osaka (JP); Kohsei Takahashi, Osaka (JP); Hiroshi Fukunaga, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/076,757

(22) Filed: Mar. 22, 2016

(65) Prior Publication Data

US 2016/0204311 A1      Jul. 14, 2016

Related U.S. Application Data

(63) Continuation of application No. 13/979,554, filed as application No. PCT/JP2012/050065 on Jan. 5, 2012, now Pat. No. 9,570,655.

(30) Foreign Application Priority Data

Jan. 18, 2011  (JP) ................................. 2011-008069
May 27, 2011  (JP) ................................. 2011-119337

(51) Int. Cl.
*H01L 33/00*     (2010.01)
*H01L 21/00*     (2006.01)
(Continued)

(52) U.S. Cl.
CPC .......... *H01L 33/26* (2013.01); *C09K 11/0883* (2013.01); *C09K 11/7734* (2013.01);
(Continued)

(58) Field of Classification Search
CPC ...................................................... H01L 27/30
(Continued)

(56) References Cited

U.S. PATENT DOCUMENTS

2003/0030368 A1    2/2003  Ellens et al.
2006/0043337 A1    3/2006  Sakane et al.
(Continued)

FOREIGN PATENT DOCUMENTS

CN       101852352      6/2010
EP       1 964 905      9/2008
(Continued)

OTHER PUBLICATIONS

International Search Report for PCT/JP2012/050065 mailed Apr. 3, 2012.
(Continued)

*Primary Examiner* — Julio J Maldonado
*Assistant Examiner* — Moin Rahman
(74) *Attorney, Agent, or Firm* — Nixon & Vanderhye P.C.

(57) ABSTRACT

Provided is a light-emitting device that has a high emission efficiency, excellent stability and temperature properties, and that generates light having a high color rendering property sufficient for practical use. This semiconductor light-emitting device comprises a semiconductor light-emitting element that emits blue light, a green phosphor that absorbs the blue light and emits green light, and an orange phosphor that absorbs the blue light and emits orange light, and is characterized in that the orange phosphor is an Eu-activated α-SiAlON phosphor having an emission spectrum peak wavelength within a range of 595 to 620 nm.

8 Claims, 21 Drawing Sheets

(51) Int. Cl.
*H01L 33/26* (2010.01)
*C09K 11/08* (2006.01)
*C09K 11/77* (2006.01)
*H01L 33/50* (2010.01)

(52) U.S. Cl.
CPC ........ *C09K 11/7774* (2013.01); *H01L 33/504* (2013.01); *H01L 33/501* (2013.01); *H01L 2224/48091* (2013.01); *H01L 2224/73265* (2013.01); *H01L 2924/181* (2013.01)

(58) Field of Classification Search
USPC ..... 257/13, 79–103, 918, 40, 642–643, 759; 438/22–47, 69, 493, 503, 507, 956
See application file for complete search history.

(56) References Cited

U.S. PATENT DOCUMENTS

| | | | |
|---|---|---|---|
| 2006/0208262 A1* | 9/2006 | Sakuma | C04B 35/597 257/79 |
| 2007/0108896 A1* | 5/2007 | Hirosaki | C04B 35/584 313/506 |
| 2007/0158560 A1 | 7/2007 | Kaneoka et al. | |
| 2007/0194695 A1 | 8/2007 | Yoon et al. | |
| 2008/0258602 A1 | 10/2008 | Masuda et al. | |
| 2008/0272688 A1 | 11/2008 | Yoshimura | |
| 2008/0297031 A1 | 12/2008 | Takahashi et al. | |
| 2009/0085464 A1 | 4/2009 | Oguma et al. | |
| 2009/0085465 A1 | 4/2009 | Hirosaki et al. | |
| 2009/0146549 A1 | 6/2009 | Kimura et al. | |
| 2009/0153028 A1 | 6/2009 | Hirosaki | |
| 2009/0168406 A1 | 7/2009 | Kawasaki et al. | |
| 2010/0027244 A1 | 2/2010 | Wada et al. | |
| 2010/0065861 A1 | 3/2010 | Nagai | |
| 2010/0208481 A1 | 8/2010 | Miyake et al. | |
| 2010/0219741 A1 | 9/2010 | Kawasaki et al. | |
| 2010/0277673 A1 | 11/2010 | Hoelen et al. | |
| 2011/0007228 A1 | 1/2011 | Yoon et al. | |
| 2011/0121234 A1 | 5/2011 | Hirosaki | |
| 2011/0227476 A1* | 9/2011 | Zhang | B32B 18/00 313/503 |
| 2012/0176568 A1 | 7/2012 | Hirosaki | |

FOREIGN PATENT DOCUMENTS

| | | |
|---|---|---|
| JP | 2005-307012 | 11/2005 |
| JP | 2006-057018 | 3/2006 |
| JP | 2006-070088 | 3/2006 |
| JP | 2006-137902 | 6/2006 |
| JP | 2006-261512 | 9/2006 |
| JP | 2007-180403 | 7/2007 |
| JP | 2007-227928 | 9/2007 |
| JP | 2009-096882 | 5/2009 |
| WO | WO 2006/061778 | 6/2006 |
| WO | WO 2007/066733 | 6/2007 |

OTHER PUBLICATIONS

K. Sakuma et al., "Efficiency Investigations of Blue Light Excitation Type for White LEDs", Proceedings of the 13th International Display Workshops (IDE '06), PH2-3, Japan, 2006, pp. 1221-1224.

K. Ohkubo et al., "Absolute Fluorescent Quantum Efficiency of NBS Phosphor Standard Samples", Journal of The Illuminating Engineering Institute of Japan, vol. 83, No. 2, 1999, pp. 87-93.

H. Watanabe et al., "Crystal Structure and Luminescence Properties of $SR_xCa_{1-x}AlSiN_3$: $EU^{2+}$ Mixed Nitride Phosphors", Journal of Alloys and Compounds, 475, 2009, pp. 434-439.

\* cited by examiner

LIGHTING DEVICE WITH PLURAL FLUORESCENT MATERIALS

This application is a continuation of U.S. patent application Ser. No. 13/979,554 filed Jul. 12, 2013, which is a U.S. national phase of International Application No. PCT/JP2012/050065 filed Jan. 5, 2012, which claims priority to Japanese Patent Application No. 2011-008069 filed Jan. 18, 2011 and Japanese Patent Application No. 2011-119337 filed May 27, 2011, the entire contents of each of which are hereby incorporated by reference.

TECHNICAL FIELD

The present invention relates to a semiconductor light-emitting device that includes a fluorescent material and a semiconductor light-emitting element.

BACKGROUND ART

Semiconductor light-emitting elements such as a light-emitting diode (LED) and the like have advantages that they are small, have a little power consumption, and are able to stably perform high brightness light emission, and in recent years, a movement is ongoing to replace illumination devices such as an incandescent light and the like with illumination devices using a light-emitting device that emits white light and includes an LED. As the LED that emits the white light, for example, there is a combination of a blue LED and a Ce-activated YAG fluorescent material that is indicated by a composition formula of $(Y, Gd)_3(Al, Ga)_5O_{12}$:Ce.

In the light-emitting device having the above structure, the white light is achieved by mixing of blue light from the LED and yellow light from the Ce-activated YAG fluorescent material as the fluorescent material. In this structure, a red color component is deficient because of a light emission property of the Ce-activated YAG fluorescent material, and in a case of being used in a home illumination device and the like, for example, a disadvantage that human skin colors look unnaturally and the like occur.

Specifically, in the above light-emitting device, in a color temperature region defined by a neutral white color and a warm white color that are used in the illumination device, an average color rendering evaluation number (hereinafter, called Ra) is about 70 to about 75, and a special color rendering evaluation number (hereinafter, called R9) indicating how the red color looks is about −40 to about −5, accordingly, when used as an illumination device, the red color looks extremely poorly.

Because of this, to improve the above color rendering property such as Ra, R9 and the like, a structure and the like are proposed, in which besides the above blue LED, a yellow fluorescent material such as a YAG fluorescent material and the like, a green fluorescent material and a red fluorescent material of a nitride relative and the like are combined. Under the circumstances, a patent document 1 discloses a white light-emitting device that uses a blue LED as an excitation light source and is obtained by combining an orange fluorescent material and a green fluorescent material that have a light emission wavelength of 560 to 590 nm as a combination that has both high color rendering property and stability. Although not as a specific example of the white light-emitting device obtained by combining fluorescent materials, this document discloses an α SiAlON fluorescent material and a β SiAlON fluorescent material as examples of the orange fluorescent material and the green fluorescent material, respectively.

A patent document 2 discloses and proposes a combination of an Eu-activated α SiAlON fluorescent material as the yellow fluorescent material, an Eu-activated β SiAlON fluorescent material as the green fluorescent material, and an Eu-activated CaAlSiN3 fluorescent material as the red fluorescent material.

Besides, a non-patent document 1 shows a relationship between: Ra of a white LED obtained by combining a fluorescent material and a blue LED; and a theoretical limit of luminous efficacy that indicates a theoretical limit of luminous efficiency of a light-emitting device. A non-patent document 2 discloses a method that is described in the non-patent document 1 and used to measure internal quantum efficiency of a fluorescent material, and a non-patent document 3 discloses Eu-activated $SrAlSiN_3$ as an example of another kind of fluorescent material that has a composition different from the fluorescent material disclosed in the present application.

CITATION LIST

Patent Literature

PLT1: JP-A-2007-227928 (the publication date: Sep. 6, 2007)
PLT2: JP-A-2006-261512 (the publication date: Sep. 28, 2006)

Non-Patent Literature

Non-patent document 1: K. Sakuma, "Efficiency Investigations of Blue Light Excitation Type for White LEDs," Proceedings of The 13th International Display Workshops (IDE '06), PH 2-3, pp. 1221-1224, Otsu, Japan (2006).
Non-patent document 2: Kazuaki Okubo and others, "Absolute Fluorescent Quantum Efficiency of NBS Phosphors Standard Samples," Journal from The Illuminating Engineering Institute of Japan, the 83th volume, the 2nd issue, p. 87 (1999).
Non-patent document 3: H. Watanabe "Crystal structure and luminescence properties of SrxCa1-xAlSiN3: Eu2+mixed nitride phosphors" Journal of Alloys and Compounds 475 (2009) 434-439.

SUMMARY OF INVENTION

Technical Problem

However, according to the structure described in the patent document 1, as shown in the non-patent document 1, in the structure where Ra is 80 or more, the theoretical limit of luminous efficacy decreases remarkably, and the luminous efficiency of the light-emitting device is not sufficient in practically useful color rendering property. On the other hand, according to the structure described in the patent document 2, the wavelength of a light emission spectrum of the red fluorescent material is a long wavelength, accordingly, the matching between the luminous efficacy curve of human and the light emission spectrum is poor, and the red light emitted from the red fluorescent material looks dark for human eyes. Besides, the red light emitted from the red fluorescent material has a large wavelength shift from the blue light that is the excitation light, accordingly, the Stokes' loss is large, besides, the red fluorescent material easily absorbs light from the fluorescent material emitting at a wavelength shorter than the red light, and it decreases the luminous efficiency to use the red fluorescent material in a semiconductor light-emitting device.

In other words, according to the structures described in the above patent documents 1 and 2, a disadvantage occurs in a case of being applied to a semiconductor light-emitting device that aims to achieve both high brightness and high color rendering property.

Because of this, the present invention has been made in light of the above problems, and it is an object of the present invention to provide a light-emitting device that has sufficiently high color rendering property in practical use without using a red fluorescent material and is high in luminous efficiency.

Solution to Problem

As described above, to provide a light-emitting device that achieves the sufficiently high color rendering property in practical use and high in luminous efficiency, the inventors repeatedly produced prototypes of a fluorescent material and a light-emitting device that uses the fluorescent material and a semiconductor light-emitting element. As a result of this, the inventors found out that it is possible to provide a light-emitting device that solves the above problems and completed the present invention by means of a combination shown hereinafter. Hereinafter, details of the present invention are described.

The semiconductor light-emitting device according to the present invention includes: a semiconductor light-emitting element that emits blue light; a green fluorescent material that absorbs the blue light to emit green light; an orange fluorescent material that absorbs the blue light to emit orange light, wherein the orange fluorescent material is an Eu-activated α SiAlON fluorescent material that has a peak wavelength of a light emission spectrum in a range of 595 to 620 nm.

According to the above structure, it becomes possible to achieve the light-emitting device that has the sufficiently high color rendering property in practical use and is high in luminous efficiency.

The semiconductor light-emitting device according to the present invention is characterized in that the above Eu-activated α SiAlON is an Eu-activated α SiAlON that is indicated by a general formula $(Ca_xEu_y)(Si_{12-(m+n)}Al_{m+n})(O_nN_{16-n})$ and designed with a composition that meets:

$1.1 \leq x < 2.0$ (1)

$0 < y < 0.4$ (2)

$1.5 < x+y < 2.0$ (3)

$3.0 \leq m < 4.0$ (4)

$0 \leq n < y$ (5)

According to the above structure, it becomes possible to achieve the light-emitting device in which the internal quantum efficiency of the Eu-activated α SiAlON becomes high and the luminous efficiency is high.

The semiconductor light-emitting device according to the present invention is characterized in that the above Eu-activated α SiAlON fluorescent material is an Eu-activated α SiAlON fluorescent material that is indicated by a general formula $(Ca_xEu_y)(Si_{12-(m+n)}Al_{m+n})(O_nN_{16-n})$ and designed with a composition that meets:

$1.1 \leq x < 1.85$ (1')

$0.15 < y < 0.4$ (2')

$1.5 < x+y < 2.0$ (3')

$3.0 \leq m < 4.0$ (4')

$0 \leq n < y$ (5')

According to the above structure, it becomes possible to achieve the light-emitting device in which the internal quantum efficiency of the Eu-activated α SiAlON, whose peak wavelength of the light emission spectrum is from 605 to 620 nm, becomes high and the luminous efficiency is high.

The semiconductor light-emitting device according to the present invention is characterized in that the peak wavelength of the light emission spectrum of the Eu-activated α SiAlON is from 605 to 620 nm. According to the above structure, it becomes possible to achieve the light-emitting device that has higher color rendering property.

The semiconductor light-emitting device according to the present invention is characterized in that an average particle diameter of the Eu-activated α SiAlON fluorescent material is 15 μm or more. According to the above structure, it becomes possible to achieve the light-emitting device that has higher color rendering property.

The semiconductor light-emitting device according to the present invention is characterized in that a specific surface area of the Eu-activated α SiAlON fluorescent material is 0.4 m²/g or smaller. According to the above structure, it becomes possible to achieve the light-emitting device that has higher luminous efficiency and higher color rendering property.

The semiconductor light-emitting device according to the present invention is characterized in that a peak wavelength of a light emission spectrum of the green fluorescent material is in a range of 520 nm to 550 nm. According to the above structure, when composing a light-emitting device for emitting white light by combining the orange fluorescent material and a semiconductor light-emitting element for emitting blue light, the light emission spectrum of the light-emitting device matches the luminous efficacy curve of human, accordingly, it becomes possible to achieve the light-emitting device that has higher luminous efficiency.

The semiconductor light-emitting device according to the present invention is characterized in that a half width of the light emission spectrum of the green fluorescent material is 55 nm or smaller. According to the above structure, cross absorption between the orange fluorescent material and the green fluorescent material is alleviated, accordingly, it becomes possible to achieve the light-emitting device that is higher in luminous efficiency and high in color rendering property.

The semiconductor light-emitting device according to the present invention is characterized in that an absorptivity of the green fluorescent material is 10% or smaller at 600 nm. According to the above structure, unnecessary absorption of the orange light by the green fluorescent material is reduced, and it becomes possible to achieve the light-emitting device that is higher in luminous efficiency.

The semiconductor light-emitting device according to the present invention is characterized in that the green fluorescent material is an Eu-activated β SiAlON fluorescent material. According to the above structure, the internal quantum efficiency of the green fluorescent material is high, and the chemical and physical stability is excellent, accordingly, it becomes possible to achieve the light-emitting device that is higher in luminous efficiency, high in stability and reliability.

The semiconductor light-emitting device according to the present invention is characterized in that an oxygen concentration of the Eu-activated β SiAlON fluorescent material is in a range of 0.1 to 0.6% by weight. According to the above structure, the light emission spectrum of the Eu-activated β SiAlON has a short wavelength, accordingly, it becomes possible to achieve the light-emitting device that is higher in color rendering property.

Advantageous Effects of Invention

The semiconductor light-emitting device according to the present invention is composed by using, as the orange fluorescent material, the Eu-activated α SiAlON fluorescent material that has the peak wavelength of the light emission spectrum in the range of 595 to 620 nm, as a result of this, it becomes possible to achieve the semiconductor light-emitting device that has sufficiently high color rendering property and high color rendering property in practical use.

DESCRIPTION OF EMBODIMENTS

An embodiment of the present invention is described as follows. In the meantime, in the present specification, the term "A to B" indicating a range means to be A or more to B or small. Besides, various properties described in the present specification mean values measured by methods explained in examples described later unless otherwise specified.

Figure 1:
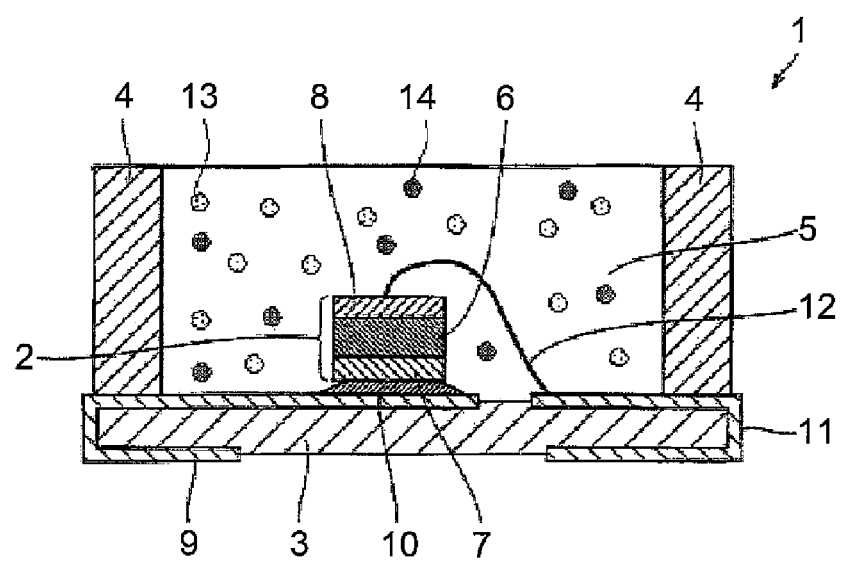
FIG. 1 is a sectional view showing a schematic structure of a semiconductor light-emitting device according to the present embodiment.

FIG. 1 is a sectional view showing a schematic structure of a semiconductor light-emitting device according to the present embodiment. The semiconductor light-emitting device 1 according to the present embodiment includes: a semiconductor light-emitting element 2 that emits blue light; an orange fluorescent material 13 that absorbs the blue light to emit orange light; and a green fluorescent material 14 that absorbs the blue light to emit green light. Here, in the present specification, the blue light means light that has a peak wavelength of a light emission spectrum in a wavelength range of 420 to 480 nm; the green light means light that has a peak wavelength of a light emission spectrum in a wavelength range of 500 to 550 nm; the orange light means light that has a peak wavelength of a light emission spectrum in a wavelength range of 560 to 620 nm; and the red light means light that has a peak wavelength of a light emission spectrum in a wavelength range of 630 to 680 nm. Besides, the green fluorescent material means a substance that is excited by the above blue light to emit the above green light; the orange fluorescent material means a substance that is excited by the above blue light to emit the above orange light; and the red fluorescent material means a substance that is excited by the above blue light to emit the above red light.

And, the above orange fluorescent material 13 is an Eu-activated α SiAlON fluorescent material that has the peak wavelength of the light emission spectrum of 595 nm or more. By selecting suitable blue light emitted from the semiconductor light-emitting element 2 and suitable green light emitted from the green fluorescent material 14 by means of the Eu-activated α SiAlON fluorescent material, it becomes possible to achieve the light-emitting device in which Ra, R9 have preferable values in practical use; the theoretical limit of luminous efficacy is extremely higher than the conventional known ones; and which is useful in practical use.

Accordingly, based on a design stance not to use the red fluorescent material, the inventors adjusted the light emission spectrum of the Eu-activated α SiAlON fluorescent material, that is, the above orange fluorescent material combined with the green fluorescent material and studied to improve color rendering performance. As a result of this, it was found out that by using the Eu-activated α SiAlON in which the light emission spectrum has a wavelength longer than the structures described in the non-patent document 1, the patent documents 1 and 2, it is possible to achieve the light-emitting device that has sufficient color rendering property in practical use without using the red fluorescent material and a preferable range of the light emission peak wavelength of the Eu-activated α SiAlON fluorescent material is 595 nm or more.

Here, sufficient values of the above Ra, R9 in practical use are intended to replace indoor illumination devices such as a fluorescent lamp and the like with the semiconductor light-emitting device. At present, in a three-wavelength fluorescent lamp that is the most common as the indoor illumination fluorescent lamp, Ra=81 or around, R9=26 or around, besides, the JIS Z9125:2007 recommends an illumination device having Ra of 80 or more as an illumination device for use in a room for work and a long stay.

Besides, the above theoretical limit efficiency is defined in the non-patent document 1 and is a theoretical limit of the luminous efficiency (lumen per watt: 1 m/W) of a light-emitting device that is calculated based on the light emission spectrum of the light-emitting device. When calculating the theoretical limit of luminous efficacy, it is assumed that conversion efficiency from power for the semiconductor light-emitting element to the blue light is 100%; and the internal quantum efficiency (IQE) of the fluorescent material is also 100%, and only the Stokes' shift loss due to the wavelength conversion by the fluorescent material is considered as a loss. In other words, it is sayable that in the light-emitting device which is composed by the semiconductor light-emitting element emitting excitation light and the fluorescent material excited by the excitation light to emit fluorescent light, the efficacy is the efficiency calculated by considering the theoretically unavoidable loss only caused by the wavelength conversion from the excitation light to the fluorescent light. In the meantime, the internal quantum efficiency of the fluorescent material can be measured by the method described in the non-patent document 2 (Kazuaki Okubo and others, "Absolute Fluorescent Quantum Efficiency of NBS Phosphors Standard Samples," Journal from The Illuminating Engineering Institute of Japan, the 83th volume, the 2nd issue, p. 87 (1999).

In FIG. 1, as to the semiconductor light-emitting device 1, the semiconductor light-emitting element 2 is placed on a printed wiring board 3 that is a base board, a mold resin 5 formed of a light-transmissive resin, in which the above orange fluorescent material 13 and the above green fluorescent material 14 are dispersed, is filled inside a resin frame 4 placed on the same printed wiring board 3, whereby the semiconductor light-emitting element 2 is encapsulated.

The above semiconductor light-emitting element 2 has an InGaN layer 6 as an active layer, and has a p-side electrode 7 and an n-side electrode 8 with the InGaN layer 6 interposed therebetween; the n-side electrode 8 is electrically connected to an n electrode portion 9, which is disposed from an upper surface to a rear surface of the printed wiring board 3, via an adhesive 10 that has electrical conductivity. Besides, the p-side electrode 7 of the semiconductor light-emitting element 2 is electrically connected to a p electrode portion 11, which is disposed separately from the above n electrode portion 9 from the upper surface to the rear surface of the printed wiring board 3, via a metal wire 12.

In the meantime, the semiconductor light-emitting device 1 according to the present embodiment is not limited to the structure shown in FIG. 1, and it is possible to employ a structure of a conventionally known general semiconductor light-emitting device.

(I) Semiconductor Light-Emitting Element

In the present embodiment, the above semiconductor light-emitting element 2 is a light-emitting diode (LED), however, is not limited to the light-emitting diode (LED), and as the semiconductor light-emitting element 2, it is possible to use conventionally known elements that emit blue light such as a semiconductor laser, an inorganic EL (electroluminescence) element and the like. In the meantime, as the LED, it is possible to use, for example, commercial products from Cree, Inc. and the like.

The light emission peak wavelength of the above semiconductor light-emitting element 2 is not limited especially, however, is preferable to be in a range of 440 nm to 470 nm from the viewpoint of raising the luminous efficiency of the semiconductor light-emitting element, and is more preferable to be in a range of 450 nm to 465 nm from the viewpoint of further raising the Ra, R9 values.

(II) Orange Fluorescent Material

The above orange fluorescent material 13 is an Eu-activated α SiAlON fluorescent material whose peak wavelength of the light emission spectrum is in a range of 595 nm to 620 nm. If the light emission peak wavelength exceeds 620 nm, the internal quantum efficiency and temperature property of the Eu-activated α SiAlON fluorescent material tend to deteriorate, accordingly, 620 nm is set.

By setting the above peak wavelength of the light emission spectrum into the above wavelength range, it is possible to achieve the semiconductor light-emitting device that has sufficiently high color rendering property in practical use and is excellent especially in luminous efficiency, stability and temperature property.

As the above Eu-activated α SiAlON fluorescent material, as shown in JP-A-2005-307012 for example, it is possible to preferably use a fluorescent material that is designed to have a low oxygen concentration by using a nitride material as a start material. This is because the α SiAlON designed to have the low oxygen concentration has a high solubility limit for elements Ca, Eu and the like other than Si, Al, O and N, and easily takes these elements into the crystal.

A composition formula of the above Eu-activated α SiAlON fluorescent material is indicated by a general formula $(Ca_xEu_y)(Si_{12-(m+n)}Al_{m+n})(O_nN_{16-n})$ and designed with a composition that meets:

$$1.1 \leq x < 2.0 \quad (1)$$

$$0 < y < 0.4 \quad (2)$$

$$1.5 < x+y < 2.0 \quad (3)$$

$$3.0 \leq m < 4.0 \quad (4)$$

$$0 \leq n < y \quad (5)$$

It is possible to produce the Eu-activated α SiAlON having the composition of the above (1) to (5) by using, for example, as the start materials, $Ca_3N_2$ as a Ca source, using AlN as an Al source, using $Si_3N_4$ as an Si source, and using both $Eu_2O_3$ and EuN as an Eu source. The above composition indicated by the above (1) to (5) is characterized by $0 \leq n < y$ and $1.5 < x+y < 2.0$. Being $0 \leq n < y$ means that the oxygen concentration is designed to be lower than the Eu concentration. Being $1.5 < x+y < 2.0$ means that the Ca concentration and the Eu concentration are designed to be near an upper limit concentration at which the α SiAlON single phase is obtained.

Besides, in the present invention, from the viewpoint of further raising Ra, R9, it is possible to use more preferably the Eu-activated α SiAlON fluorescent material having the peak wavelength of the light emission spectrum of 605 nm to 620 nm, and the composition formula of this Eu-activated α SiAlON fluorescent material is indicated by a general formula $(Ca_xEu_y)(Si_{12-(m+n)}Al_{m+n})(O_nN_{16-n})$ and designed with a composition that meets:

$$1.1 \leq x < 1.85 \quad (1')$$

$$0.15 < y < 0.4 \quad (2')$$

$$1.5 < x+y < 2.0 \quad (3')$$

$$3.0 \leq m < 4.0 \quad (4')$$

$$0 \leq n < y \quad (5')$$

It is possible to produce the Eu-activated α SiAlON having the composition of the above (1') to (5') by using, for example, as the start materials, $Ca_3N_2$ as the Ca source, using AlN as the Al source, using $Si_3N_4$ as the Si source, and using both $Eu_2O_3$ and EuN as the Eu source. Besides, the above composition of the (1') to (5') is characterized in that the y value is large compared with the (1) to (5). The large y value means that the Eu concentration is designed high, and in the composition of (1') to (5'), by designing the Eu concentration high compared with the (1) to (5), the peak wavelength of the luminous efficiency of 605 nm to 620 nm is achieved.

Besides, in the production process of the above Eu-activated α SiAlON fluorescent material, as disclosed in JP-A-2009-96882 for example, it is possible to preferably use a seed particle addition process to add an α SiAlON powder as a seed particle. This is because the α SiAlON fluorescent material designed to have the low oxygen concentration has a low oxygen concentration during a calcination time, accordingly, it is hard for a particle growth through a liquid phase to occur. Besides, also a rinse process by means of an acid treatment as shown in JP-A-2005-255855 can be preferably applied to the production process of the above Eu-activated α SiAlON.

It is preferable that the particle diameter of the above orange fluorescent material 14 is 1 μm to 50 μm, and is more preferable to be 5 μm to 20 μm. Besides, it is preferable that the particle shape is a single particle rather than an aggregate, specifically, it is preferable that the specific surface area measured by an air permeability method is 1 m²/g or smaller, more preferably 0.4 m²/g or smaller. For these particle diameter adjustment and particle shape adjustment, it is possible to suitably use technologies such as mechanical smashing, grain boundary phase removing by the acid treatment, annealing and the like. Here, the air permeability method refers to a method generally called a LEA-NURSE method, and it is possible to obtain the specific surface area by measuring a flow speed and pressure decline of air passing through a sample filled layer.

In the meantime, as another nitride orange fluorescent material having the peak wavelength of the light emission spectrum of 620 nm or smaller, the non-patent document 3 discloses Eu-activated $SrAlSiN_3$ that is a fluorescent material substance which has the peak wavelength of the light emission spectrum of 610 nm, emits orange light with high internal quantum efficiency at blue excitation, and is chemically stable; however, compared with the Eu-activated α SiAlON fluorescent material, the Eu-activated $SrAlSiN_3$ has a high absorptivity in the green light wavelength range and absorbs the green light emitted from the green fluorescent material, accordingly, it is more preferable to use the Eu-activated α SiAlON fluorescent material as the orange fluorescent material.

(IV) Green Fluorescent Material

As the green fluorescent material 14, from the viewpoint of raising the luminous efficiency of the semiconductor light-emitting device, it is possible to use a fluorescent material whose peak wavelength is in a range of 520 nm to 550 nm. If the peak wavelength of the light emission spectrum of the green fluorescent material 14 is in the above range, when the light-emitting device 1 emitting the white light is composed by combining the above orange fluorescent material 13 and the semiconductor light-emitting element 2 emitting the blue light with each other, it is possible to obtain a light emission spectrum that matches the luminous efficacy curve of human. Because of this, it becomes possible to achieve the light-emitting device that is high in luminous efficiency.

Besides, it is preferable that the above green fluorescent material 14 has a half width of the light emission spectrum of 70 nm or smaller, and more preferably has a half width in a range of 55 nm or smaller. Besides, a lower limit of the half width of the light emission spectrum of the above green fluorescent material 14 is not especially limited, however, preferably 15 nm or more.

When the half width of the light emission spectrum of the green fluorescent material 14 is in the above range, the overlapping between the absorption spectrum of the above orange fluorescent material 13 and the light emission spectrum of the green fluorescent material 14 becomes sufficiently small, accordingly, the green light absorption by the orange fluorescent material 13 is alleviated and it is possible to achieve the light-emitting device that is higher in luminous efficiency.

The above green fluorescent material 14 is not especially limited, however, for example, an Eu-activated oxynitride fluorescent material is preferably used because of high stability and excellent temperature property.

Further, because of being excellent in luminous efficiency among the Eu-activated oxynitride fluorescent materials, an Eu-activated BSON fluorescent material shown in JP-A-2008-138156 and an Eu-activated β SiAlON fluorescent material shown in JP-A-2005-255895 are preferably used.

Among the examples described as the above green fluorescent material 14, the Eu-activated β SiAlON fluorescent material is excellent in stability and temperature property, besides, has an especially narrow half width of the light emission spectrum, and shows an excellent light emission property.

It is preferable that a composition of the above Eu-activated BSON fluorescent material is $Ba_{y'}Eu_{x'}O_{v'}N_{w'}$ (where $0 \leq y' \leq 3$, $1.6 \leq y'+x' \leq 3$, $5 \leq u' \leq 7$, $9 < v' < 15$, $0 < w' \leq 4$) and a more preferable range of the above y', x', u', v', and w' is $1.5 \leq y' \leq 3$, $2 \leq y'+x' \leq 3$, $5.5 \leq u' \leq 7$, $10 < v' < 13$, and $1.5 < w' \leq 4$.

Besides, it is preferable that a composition of the above Eu-activated β SiAlON fluorescent material is $Si_{6-z'}Al_{z'}O_{z'}N_{8-z'}$ (where $0 < z' < 4.2$), and a more preferable range of z' is $0 < z' < 0.5$.

Besides, the above Eu-activated β SiAlON has preferably an oxygen concentration range of 0.1 to 0.6% by weight, and has more preferably an Al concentration of 0.13 to 0.8% by weight. When the Eu-activated β SiAlON fluorescent material is in these ranges, the half width of the light emission spectrum tends to become narrow.

In the meantime, as to the Eu-activated β SiAlON fluorescent material disclosed in the international publication no. WO2008/062781, the florescer's damaged phase is removed after calcination by post-treatments such as the acid treatment and the like, accordingly, unnecessary absorption is slight and the light emission efficiency is high. Further, the Eu-activated β SiAlON fluorescent material disclosed in JP-A-2008-303331 has an oxygen concentration of 0.1 to 0.6% by weight, the half width of the light emission spectrum becomes narrow, which is preferable.

As the above green fluorescent material 14, more specifically, it is possible to preferably use a fluorescent material which has a light absorptivity of 10% or smaller at 600 nm that is in a wavelength region having no contribution to the light emission of the β SiAlON fluorescent material and is near the peak wavelength of the above orange fluorescent material.

It is preferable that the particle diameter of the above green fluorescent material 14 is 1 μm to 50 μm, and is more preferable to be 5 μm to 20 μm. Besides, it is preferable that the particle shape is a single particle rather than an aggregate, specifically, it is preferable that the specific surface area is 1 m²/g or smaller, more preferably 0.4 m²/g or smaller. For these particle diameter adjustment and particle shape adjustment, it is possible to suitably use the technologies such as mechanical smashing, grain boundary phase removing by the acid treatment, annealing and the like.

Besides, in the case where the green fluorescent material 14 used in the present embodiment is the Eu-activated oxynitride fluorescent material, both the green fluorescent material 14 and the orange fluorescent material 13 are oxynitrides, accordingly, the temperature dependencies, specific gravities, particle diameters and the like of the two kinds of fluorescent materials have values approximate to each other. Because of this, when the above semiconductor light-emitting element is formed, it becomes possible to perform the production with a good yield. In addition, the oxynitride fluorescent material has strong covalent bonding of the host crystal, accordingly, especially has slight temperature dependency, and is durable to a chemical and physical damage, therefore, serves as a light-emitting element that is not influenced by a surrounding environment and has high stability and reliability.

Besides, as other green fluorescent materials, it is possible to use conventionally known fluorescent materials such as: a Ce-activated aluminate garnet fluorescent material expressed by $(Re_{1-x}Gd_x)3(Al_{1-y}Ga_y)_5O_{12}$:Ce (Re=Y, Lu, Tb, $0 \leq x \leq 1$, $0 \leq y \leq 1$); a Ce-activated silicate garnet fluorescent material expressed by $(Ca, Mg)_3Sc_2Si_3O_{12}$:Ce; an Eu-activated alkaline earth silicon oxynitride fluorescent material expressed by $MSi_2O_2N_2$:Eu (M=Ba, Ca, Sr, Mg); an Eu-activated alkaline earth silicate fluorescent material expressed by $M_2SiO_4$:Eu (M=Ba, Ca, Sr, Mg) and the like.

(V) Mold Resin

In the above semiconductor light-emitting device 1, the mold resin 5 used to encapsulate the semiconductor light-emitting element 2 is obtained by dispersing the above orange fluorescent material 13 and the above green fluorescent material 14 into, for example, a light-transmissive resin such as a silicone resin, an epoxy resin and the like. The dispersion method is not especially limited, and it is possible to employ a conventionally known method.

A mixing ratio of the orange fluorescent material 13 and the green fluorescent material 14 dispersed is not especially limited, and is suitably decidable such that a spectrum indicating a desired white point is obtained.

For example, it is possible to set a mass ratio of the light-transmissive resin to the orange fluorescent material 13 and green fluorescent material 14 (the mass of the light-transmissive resin/(the orange fluorescent material 13+the green fluorescent material 14)) into a range of 1 to 15. Further, it is possible to set a mas ratio of the green fluorescent material 14 to the orange fluorescent material 13 (the mass ratio of (the green fluorescent material 14/the orange fluorescent material 13)) into a range of 0.5 to 4.

(VI) Others

In the semiconductor light-emitting device according to the present embodiment, as to the printed wiring board 3, the adhesive 10, the metal wire 12 and the like other than the semiconductor light-emitting element 2, the orange fluorescent material 13, the green fluorescent material 14 and the mold resin 5, it is possible to use the same structure as conventional technologies (e.g., JP-A-2003-321675, JP-A-2006-8721 and the like) and it is possible to perform the production in the same way as the conventional technologies.

EXAMPLES

Hereinafter, the present invention is described in more detail with reference to examples and comparative examples, however, the present invention is not limited to these examples.

[1] Fluorescent Material Production

Hereinafter, production methods and properties of respective fluorescent materials used in the examples and comparative examples are described. Besides, a table 1 shows a list of chemical formulae, fluorescent material properties, applications of the examples·comparative examples of the respective fluorescent materials (production examples 1-1 to 1-3, 2-1 to 2-4, comparative production examples 1, 2).

TABLE 1

| | FLUORESCENT MATERIAL | | CHEMICAL FORMULA | LIGHT EMISSION PEAK WAVELENGTH (nm) | HALF (WIDTH) (nm) |
|---|---|---|---|---|---|
| PRODUCTION EXAMPLE 1-1 | ORANGE COLOR | Eu-ACTIVATED α SiAlON | $(Ca_{1.8}Eu_{0.075})(Si_{8.2}Al_{3.8})(O_{0.05}N_{15.95})$ | 597 | 93 |
| PRODUCTION EXAMPLE 1-2 | ORANGE COLOR | Eu-ACTIVATED α SiAlON | $(Ca_{1.7}Eu_{0.2})(Si_{8.2}Al_{3.8})N_{16}$ | 610 | 92 |
| PRODUCTION EXAMPLE 1-3 | ORANGE COLOR | Eu-ACTIVATED α SiAlON | $(Ca_{1.7}Eu_{0.2})(Si_{8.2}Al_{3.8})N_{16}$ | 610 | 92 |
| PRODUCTION EXAMPLE 2-1 | GREEN COLOR | Eu-ACTIVATED β SiAlON | $Si_{5.77}Al_{0.23}O_{0.23}N_{7.77}Eu_{0.013}$ | 540 | 53 |
| PRODUCTION EXAMPLE 2-2 | GREEN COLOR | Eu-ACTIVATED β SiAlON | $Si_{5.94}Al_{0.06}O_{0.06}N_{7.94}Eu_{0.014}$ | 528 | 51 |
| PRODUCTION EXAMPLE 2-3 | GREEN COLOR | Eu-ACTIVATED BSON | $Ba_{2.07}Eu_{0.13}Si_7O_{10.2}N_4$ | 528 | 69 |
| PRODUCTION EXAMPLE 2-4 | GREEN COLOR | Ce-ACTIVATED $Lu_3Al_5O_{12}$ $((Lu_{3-x}Ce_x)Al_5O_{12})$ | $Lu_{2.7}Ce_{0.3}Al_5O_{12}$ | 540 | 110 |
| COMPARATIVE PRODUCTION EXAMPLE 1 | ORANGE COLOR | Eu-ACTIVATED α SiAlON | $(Ca_{0.75}Eu_{0.08})(Si_{9.38}Al_{2.62})(O_{0.95}N_{15.05})$ | 585 | 94 |
| COMPARATIVE PRODUCTION EXAMPLE 2 | RED COLOR | Eu-ACTIVATED $CaAlSiN_3$ | $Ca_{0.992}Eu_{0.008}SiAlN_3$ | 649 | 90 |

| | LIGHT ABSORPTIVITY @600 nm (%) | INTERNAL QUANTUM EFFICIENCY (%) | CHROMATICITY x | CHROMATICITY y | EXAMPLE | COMPARATIVE EXAMPLE |
|---|---|---|---|---|---|---|
| PRODUCTION EXAMPLE 1-1 | — | 71 | 0.559 | 0.438 | EXAMPLE 1, 3, 5, 7, 10, 12, 14 | — |
| PRODUCTION EXAMPLE 1-2 | — | 70 | 0.587 | 0.411 | EXAMPLE 2, 4, 6, 8, 9, 11, 13, 15 | — |
| PRODUCTION EXAMPLE 1-3 | — | 70 | 0.587 | 0.411 | EXAMPLE 16 | — |
| PRODUCTION EXAMPLE 2-1 | 9.1 | 73 | 0.325 | 0.644 | EXAMPLE 1, 2, 9 | COMPARATIVE EXAMPLE 1~6 |
| PRODUCTION EXAMPLE 2-2 | 12.5 | 69 | 0.289 | 0.674 | EXAMPLE 3, 4, 10, 11 | COMPARATIVE EXAMPLE 7 |
| PRODUCTION EXAMPLE 2-3 | 8.2 | 72 | 0.287 | 0.623 | EXAMPLE 5, 6, 12, 13 | COMPARATIVE EXAMPLE 8 |
| PRODUCTION EXAMPLE 2-4 | 9.3 | 73 | 0.420 | 0.554 | EXAMPLE 7, 8, 14, 15 | COMPARATIVE EXAMPLE 9 |
| COMPARATIVE PRODUCTION EXAMPLE 1 | — | 73 | 0.509 | 0.484 | — | COMPARATIVE EXAMPLE 1, 2, 4, 5, 7, 8, 9 |
| COMPARATIVE PRODUCTION EXAMPLE 2 | — | 80 | 0.657 | 0.340 | — | COMPARATIVE EXAMPLE 2, 3, 5, 6 |

Production Example 1-1: Production 1 of Orange Fluorescent Material (Eu-Activated α SiAlON Fluorescent Material)

To obtain a fluorescent material in which x=1.8, y=0.075, m=3.75, n=0.05 in the composition formula $(Ca_xEu_y)(Si_{12-(m+n)}Al_{m+n})(O_nN_{16-n})$, weighing is performed to obtain, as raw material powders, 59.8 mass % of α type silicon nitride powder, 24.3 mass % of aluminum nitride power, 13.9 mass % of calcium nitride powder, 0.9 mass % of europium oxide powder, and 1.1 mass % of europium nitride powder, and mixing is performed for 10 minutes or more by using a mortar and pestle formed of silicon nitride sintered body to obtain a powder aggregate. In the meantime, as the europium nitride, a synthetic, which is obtained by nitriding metal europium in ammonia, is used.

The obtained powder aggregate is made to pass through a sieve having an aperture of 250 μm and filled into a crucible that has a size of 20 mm in diameter, 20 mm in height and is formed of boron nitride. In the meantime, all the respective processes of the weighing, mixing, and forming of the powder are performed in a glove compartment that is able to hold a nitrogen atmosphere that contains water of 1 ppm or smaller and oxygen of 1 ppm or smaller.

Next, the crucible is set into a pressure electric furnace of graphite resistance heating type; nitrogen having a purity of 99.999 volume % is introduced to obtain a pressure of 1 MPa; the crucible is raised to 1800° C. in 500° C. increments per hour, further kept at 1800° C. for 2 hours, then, a heat treatment is performed. A product obtained by the heat treatment is smashed by means of an agate mortar, further, treated at 60° C. in a 1:1 mixed acid of 50% of hydrofluoric acid and 96% of concentrated sulfuric acid, whereby a fluorescent material powder is obtained. Applying powder X ray diffraction measurement (XRD) to the obtained fluorescent material powder by using K α rays of Cu, it is found out that the fluorescent material powder has an α SiAlON crystal structure. Besides, as a result of casting light onto the fluorescent material powder by means of a lamp that emits light having a wavelength of 365 nm, it is confirmed that orange color light is emitted.

Figure 2A:
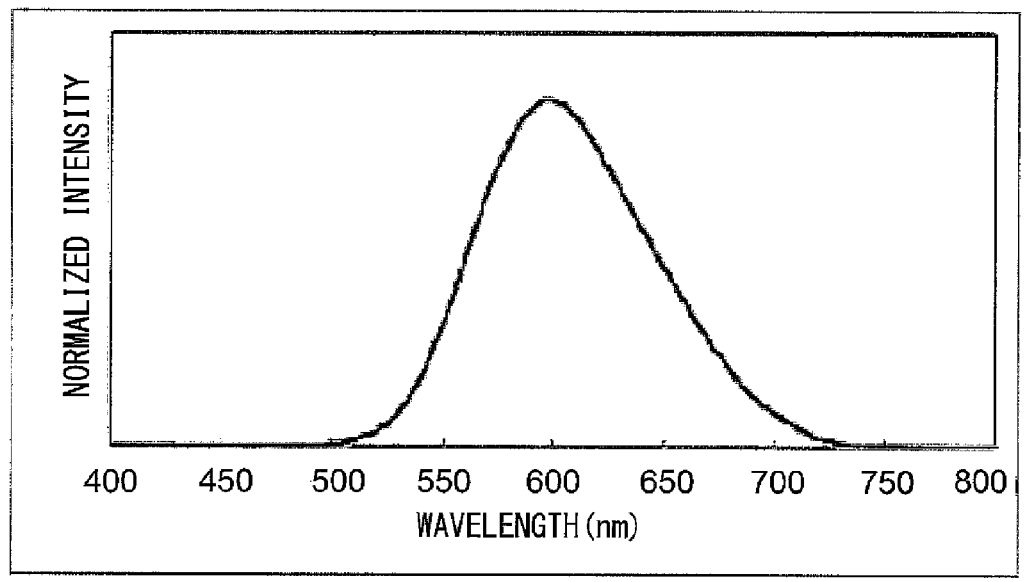
FIG. 2A is a graph showing a light emission spectrum of a fluorescent material obtained in a production example 1-1.

FIG. 2A is a graph showing a light emission spectrum of the obtained fluorescent material powder; the vertical axis is the relative light emission intensity (arbitrary unit), while the horizontal axis is the wavelength (nm). Besides, FIG. 2B is a graph showing an excitation spectrum of the obtained fluorescent material powder; the vertical axis is the relative light emission intensity (arbitrary unit), while the horizontal axis is the wavelength (nm).

Figure 2B:
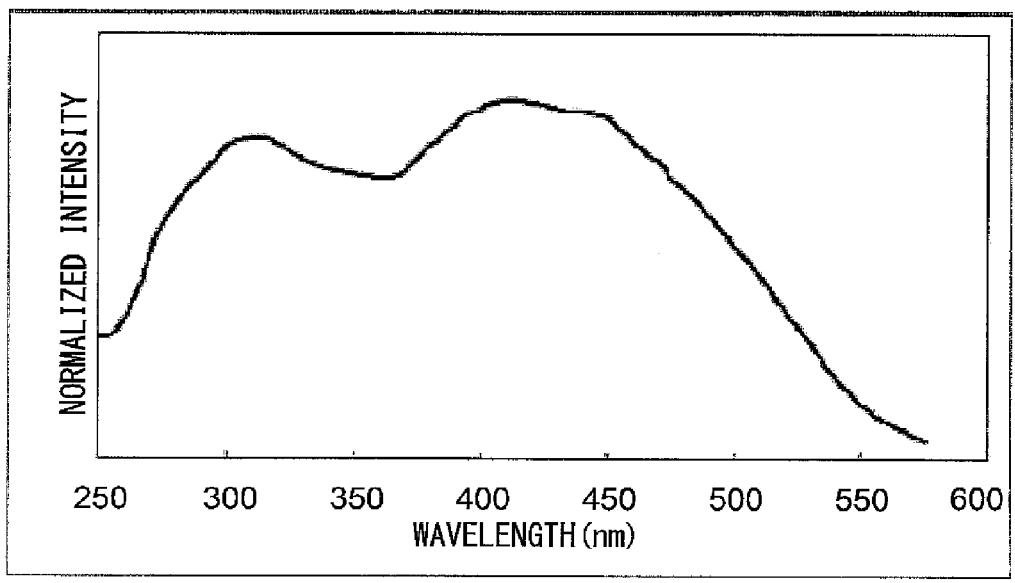
FIG. 2B is a graph showing an excitation spectrum of the fluorescent material obtained in the production example 1-1.

In the meantime, the excitation spectrum and light emission spectrum of the fluorescent material powder shown in FIG. 2A and FIG. 2B are results of measurement using the F-4500 (from Hitachi, Ltd.). The light emission spectrum is measured by performing the excitation by means of light of 450 nm, while the excitation spectrum is measured by scanning the intensity of the light emission peak. As to the chromaticity coordinates of the light emission spectrum shown in FIG. 2A, (x, y)=(0.559, 0.438), the peak wavelength is 597 nm, and the half width is 93 nm.

Besides, the internal quantum efficiency of the fluorescent material shown in the present production example 1-1, which is measured by a measurement system obtained by combining the MCPD-7000 and an integrating sphere with each other, is 71%.

Further, the specific surface area of the obtained fluorescent material powder, which is measured by the LEA-NURSE from TSUTSUI SCIENTIFIC INSTRUMENTS, CO., LTD., is 0.36 m$^2$/g, and the average particle diameter, which is measured by an SEM image observed by the VE- from KEYENCE CORPORATION, is 16.2 μm.

Production Example 1-2: Production 2 of Orange Fluorescent Material (Eu-Activated α SiAlON Fluorescent Material)

To obtain a fluorescent material in which x=1.7, y=0.2, m=3.8, n=0 in the composition formula $(Ca_xEu_y)(Si_{12-(m+n)}Al_{m+n})(O_nN_{16-n})$, weighing is performed to obtain, as raw material powders, 58.4 mass % of a type silicon nitride powder, 23.7 mass % of aluminum nitride power, 12.8 mass % of calcium nitride powder, and 5.1 mass % of europium nitride powder, and mixing is performed for 10 minutes or more by using a mortar and pestle formed of silicon nitride sintered body to obtain a powder aggregate.

The obtained powder aggregate is made to pass through a sieve having an aperture of 250 μm and filled into a crucible that has a size of 20 mm in diameter, 20 mm in height and is formed of boron nitride. In the meantime, all the respective processes of the weighing, mixing, and forming of the powder are performed in a glove compartment that is able to hold a nitrogen atmosphere that contains water of 1 ppm or smaller and oxygen of 1 ppm or smaller.

Next, the crucible is set into a pressure electric furnace of graphite resistance heating type; nitrogen having a purity of 99.999 volume % is introduced to obtain a pressure of 1 MPa; a heat treatment is performed such that the crucible is raised to 1800° C. in 500° C. increments per hour; further kept at 1800° C. for 2 hours. A product obtained by the heat treatment is smashed by means of an agate mortar, further, treated at 60° C. in a 1:1 mixed acid of 50% of hydrofluoric acid and 96% of concentrated sulfuric acid, whereby a fluorescent material powder is obtained. Applying the powder X ray diffraction measurement (XRD) to the obtained fluorescent material powder by using K α rays of Cu, it is found out that the fluorescent material powder has an α SiAlON crystal structure. Besides, as a result of casting light onto the fluorescent material powder by means of a lamp that emits light having a wavelength of 365 nm, it is confirmed that orange color light is emitted.

Figure 3A:
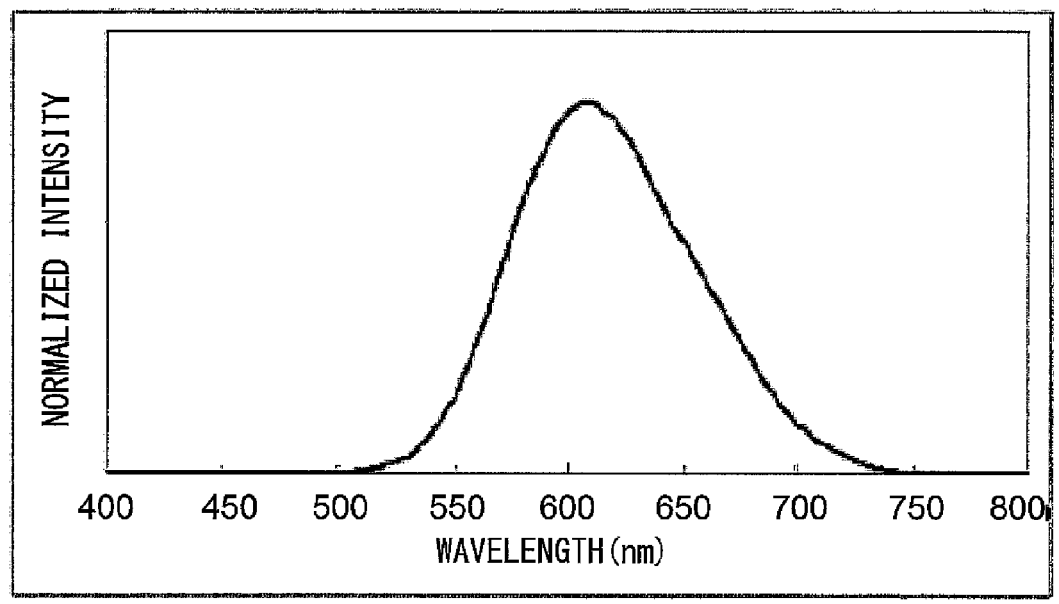
FIG. 3A is a graph showing a light emission spectrum of a fluorescent material obtained in a production example 1-2.

FIG. 3A is a graph showing a light emission spectrum of the obtained fluorescent material powder; the vertical axis is the relative light emission intensity (arbitrary unit), while the horizontal axis is the wavelength (nm). Besides, FIG. 3B is a graph showing an excitation spectrum of the obtained fluorescent material powder; the vertical axis is the relative light emission intensity (arbitrary unit), while the horizontal axis is the wavelength (nm).

Figure 3B:
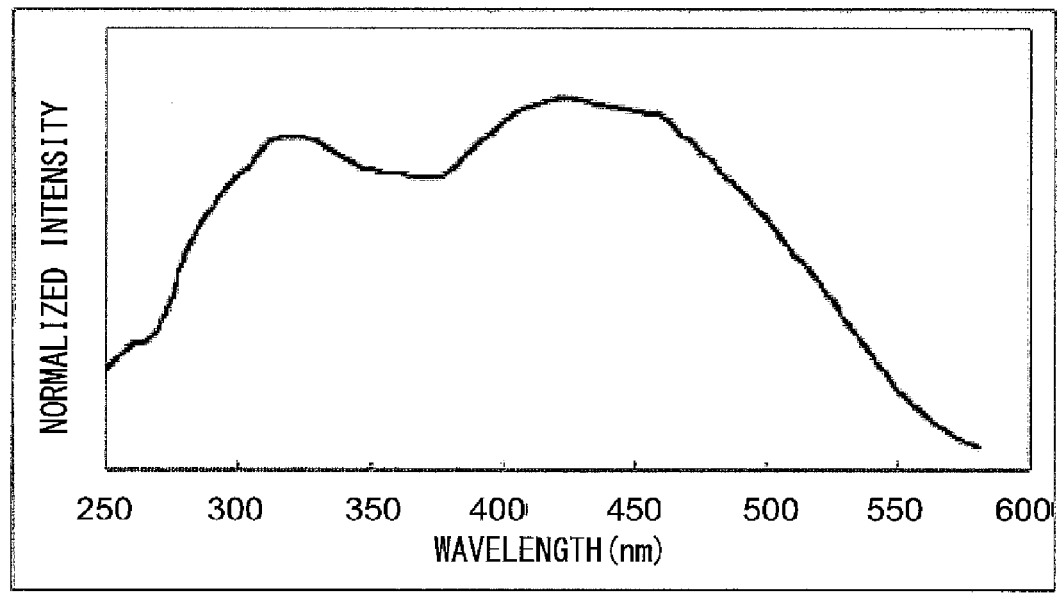
FIG. 3B is a graph showing an excitation spectrum of the fluorescent material obtained in the production example 1-2.

In the meantime, the excitation spectrum and light emission spectrum of the fluorescent material powder shown in FIG. 3A and FIG. 3B are results of measurement using the F-4500 (from Hitachi, Ltd.). The light emission spectrum is measured by performing the excitation by means of light of 450 nm, while the excitation spectrum is measured by scanning the intensity of the light emission peak. As to the chromaticity coordinates of the light emission spectrum shown in FIG. 3A, (x, y)=(0.587, 0.411), the peak wavelength is 610 nm, and the half width is 92 nm.

Besides, the internal quantum efficiency of the fluorescent material shown in the present production example 1-2, which is measured by a measurement system obtained by combining the MCPD-7000 and an integrating sphere with each other, is 70%.

Further, the specific surface area of the obtained fluorescent material powder, which is measured by the LEA-NURSE from TSUTSUI SCIENTIFIC INSTRUMENTS, CO., LTD., is 0.38 m$^2$/g, and the average particle diameter, which is measured by an SEM image observed by the VE- from KEYENCE CORPORATION, is 15.3 μm.

Production Example 1-3: Production 3 of Orange Fluorescent Material (Eu-Activated α SiAlON Fluorescent Material)

To obtain a fluorescent material in which x=1.7, y=0.2, m=3.8, n=0 in the composition formula $(Ca_xEu_y)(Si_{12-(m+n)}Al_{m+n})(O_nN_{16-n})$ that is the same design composition as the production example 1-2, a predetermined amount of raw material powder is weighed, and mixing is performed for 10 minutes or more by using a mortar and pestle formed of silicon nitride sintered body to obtain a powder aggregate.

The obtained powder aggregate is made to pass through a sieve having an aperture of 250 μm and filled into a crucible that has a size of 20 mm in diameter, 20 mm in height and is formed of boron nitride. In the meantime, all the respective processes of the weighing, mixing, and forming of the powder are performed in a glove compartment that is able to hold a nitrogen atmosphere that contains water of 1 ppm or smaller and oxygen of 1 ppm or smaller.

Next, the crucible is set into a pressure electric furnace of graphite resistance heating type; nitrogen having a purity of 99.999 volume % is introduced to obtain a pressure of 1 MPa; the crucible is raised to 1700° C. in 500° C. increments per hour, further kept at 1700° C. for 2 hours, then, a heat treatment is performed. A product obtained by the heat treatment is smashed by means of an agate mortar, further, treated at 60° C. in a 1:1 mixed acid of 50% of hydrofluoric acid and 96% of concentrated sulfuric acid, whereby a fluorescent material powder is obtained. Applying the powder X ray diffraction measurement (XRD) to the obtained fluorescent material powder by using K α rays of Cu, it is found out that the fluorescent material powder has an α SiAlON crystal structure. Besides, as a result of casting light onto the fluorescent material powder by means of a lamp that emits light having a wavelength of 365 nm, it is confirmed that orange color light is emitted. The light emission properties of the obtained powder such as the light emission spectrum, the excitation spectrum and the like are the same as the orange fluorescent material obtained in the production example 1-2.

Further, the specific surface area of the obtained fluorescent material powder, which is measured by the LEA-NURSE from TSUTSUI SCIENTIFIC INSTRUMENTS, CO., LTD., is 0.78 m$^2$/g, and the average particle diameter, which is measured by an SEM image observed by the VE- from KEYENCE CORPORATION, is 11.2 μm.

Production Example 2-1: Production of Green Fluorescent Material (Eu-Activated β SiAlON Fluorescent Material)

To obtain an Eu-activated β SiAlON fluorescent material in which z'=0.23 in a composition formula expressed by $Si_{6-z'}Al_{z'}O_{z'}N_{8-z'}$, and Eu is activated by 0.09 at. %, weighing is performed to obtain a composition of 95.82 mass % of α type silicon nitride powder, 3.37 mass % of aluminum nitride power, and 0.81 mass % of europium oxide powder, and mixing is performed for 10 minutes or more by using a mortar and pestle formed of silicon nitride sintered body to obtain a powder aggregate. This powder aggregate is made to free-fall to be filled into a crucible formed of boron nitride.

Next, the crucible is set into a pressure electric furnace of graphite resistance heating type; the calcination atmosphere is vacuumed by a diffusion pump; the crucible is heated from a room temperature to 800° C. in 500° C. increments per hour; nitrogen having a purity of 99.999 volume % is introduced at 800° C. to obtain a pressure of 1 MPa; thereafter, the crucible is raised to 1900° C. in 500° C. increments per hour, further kept at the temperature for 8 hours to obtain a fluorescent material sample. The obtained fluorescent material sample is smashed by means of an agate mortar, further, treated at 60° C. in a 1:1 mixed acid of 50% of hydrofluoric acid and 70% of nitric acid, whereby a fluorescent material powder is obtained.

Applying the powder X ray diffraction measurement (XRD) to the obtained fluorescent material powder by using K α rays of Cu, it is found out that the fluorescent material powder has a β type SiAlON structure. Besides, as a result of casting light onto the fluorescent material powder by means of a lamp that emits light having a wavelength of 365 nm, it is confirmed that green color light is emitted.

Figure 4:
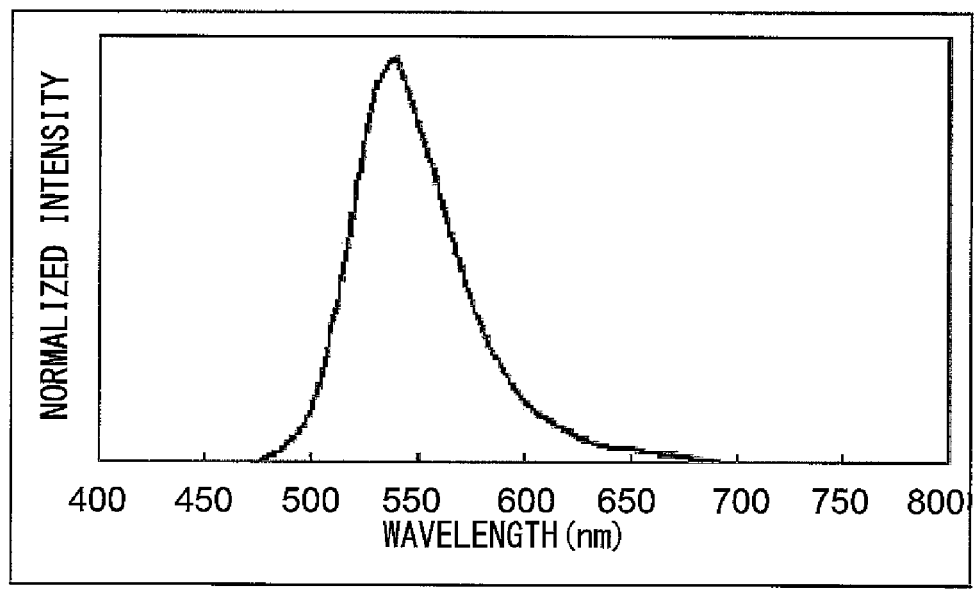
FIG. 4 is a graph showing a light emission spectrum of a fluorescent material obtained in a production example 2-1.

As a result of measuring a light emission spectrum by using the F-4500 (from Hitachi, Ltd.) when exciting the powder of the obtained Eu-activated β SiAlON fluorescent material by means of light of 450 nm, the light emission spectrum shown in FIG. 4 is obtained. In FIG. 4, the vertical axis is the light emission intensity (arbitrary unit), while the horizontal axis is the wavelength (nm).

As to the chromaticity coordinates of the light emission spectrum shown in FIG. 4, (x, y)=(0.325, 0.644), the peak wavelength is 540 nm, and the half width is 53 nm. Besides, the light absorptivity at a wavelength of 600 nm, which is measured by using the MCPD-7000 (from Otsuka Electronics Co., Ltd.), is 9.1%.

Besides, the internal quantum efficiency of the fluorescent material shown in the present production example 2-1, which is measured by a measurement system obtained by combining the MCPD-7000 and an integrating sphere with each other, is 73%.

Further, the specific surface area of the obtained fluorescent material powder, which is measured by the LEA-NURSE from TSUTSUI SCIENTIFIC INSTRUMENTS, CO., LTD., is 0.80 m$^2$/g, and the average particle diameter, which is measured by an SEM image observed by the VE- from KEYENCE CORPORATION, is 9.2 μm.

Production Example 2-2: Adjustment 2 of Eu-Activated β SiAlON Fluorescent Material To obtain an Eu-activated β SiAlON fluorescent material in which z'=0.06 in the composition formula expressed by $Si_{6-z'}Al_{z'}O_{z'}N_{8-z'}$' and Eu is activated by 0.10 at. %, a predetermined amount is weighed to obtain a composition of 93.59 weight % of metal Si powder, 5.02 weight % of aluminum nitride power, and 1.39 weight % of europium oxide powder that have passed through a sieve of 45 μm, and mixing is performed for 10 minutes or more by using a mortar and pestle formed of silicon nitride sintered body to obtain a powder aggregate. This powder aggregate is made to free-fall into a crucible formed of boron nitride that has a size of 20 mm in diameter, 20 mm in height.

Next, the crucible is set into a pressure electric furnace of graphite resistance heating type; the calcination atmosphere is vacuumed by a diffusion pump; the crucible is heated from a room temperature to 800° C. at a speed of 500° C. increments per hour; nitrogen having a purity of 99.999 volume % is introduced at 800° C. to obtain a pressure of 0.5 MPa; the crucible is raised to 1300° C. in 500° C. increments per hour, thereafter, raised to 1600° C. in 1° C. increments per minute and kept at the temperature for 8 hours. The synthesized sample is smashed by means of an agate mortar into a powder to obtain a powder sample.

Next, the heat treatment is reapplied to the powder. The powder calcined at 1600° C. is smashed by using a mortar and pestle formed of silicon nitride sintered body, thereafter, is made to free-fall into a crucible that is formed of boron nitride and has a size of 20 mm in diameter, 20 mm in height.

The crucible is set into a pressure electric furnace of graphite resistance heating type; the calcination atmosphere is vacuumed by a diffusion pump; the crucible is heated from a room temperature to 800° C. at a speed of 500° C. increments per hour; nitrogen having a purity of 99.999 volume % is introduced at 800° C. to obtain a pressure of 1 MPa; thereafter, the crucible is raised to 1900° C. in 500° C. increments per hour, further kept at the temperature for 8 hours to obtain a fluorescent material sample. The obtained fluorescent material sample is smashed by means of an agate mortar, further, treated at 60° C. in a 1:1 mixed acid of 50% of hydrofluoric acid and 70% of nitric acid, whereby a fluorescent material powder is obtained.

Applying the powder X ray diffraction measurement (XRD) to the fluorescent material powder, it is found out that the fluorescent material powder has a β type SiAlON structure. Besides, as a result of casting light onto the fluorescent material powder by means of a lamp that emits light having a wavelength of 365 nm, it is confirmed that green color light is emitted.

Figure 5:
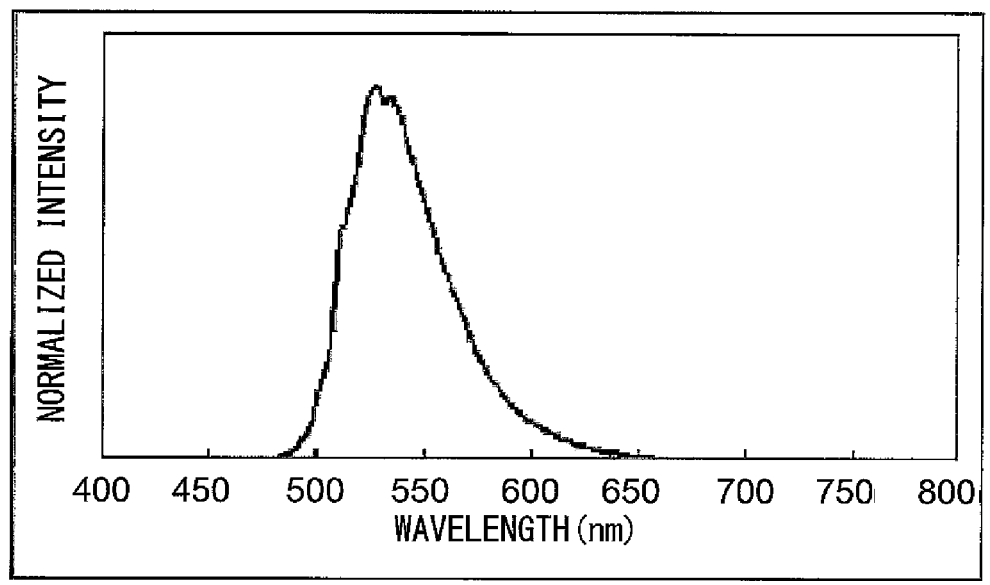
FIG. 5 is a graph showing a light emission spectrum of a fluorescent material obtained in a production example 2-2.

As a result of measuring a light emission spectrum of the powder of the obtained Eu-activated β SiAlON fluorescent material, the light emission spectrum shown in FIG. 5 is obtained. In FIG. 5, the vertical axis is the light emission intensity (arbitrary unit), while the horizontal axis is the wavelength (nm). As to the chromaticity coordinates of the light emission spectrum shown in FIG. 5, (x, y)=(0.289, 0.674), the peak wavelength is 528 nm, and the half width is 51 nm. Besides, measuring an oxygen amount contained in the synthetic powder by using an oxygen/nitrogen analyzer (the TC436 type from LECO Corporation) with a combustion method, the oxygen content is 0.4 weight %. Besides, the light absorptivity at a wavelength of 600 nm, which is measured by using the MCPD-7000 (from Otsuka Electronics Co., Ltd.), is 12.5%.

Besides, the internal quantum efficiency of the fluorescent material shown in the present production example 2-2, which is measured by a measurement system obtained by combining the MCPD-7000 and an integrating sphere with each other, is 69%.

Further, the specific surface area of the obtained fluorescent material powder, which is measured by the LEA-NURSE from TSUTSUI SCIENTIFIC INSTRUMENTS, CO., LTD., is 0.83 $m^2/g$, and the average particle diameter, which is measured by an SEM image observed by the VE- from KEYENCE CORPORATION, is 10.3 μm.

Production Example 2-3: Production of Green Fluorescent Material (Eu-Activated BSON Fluorescent Material)

To obtain an fluorescent material having a composition formula expressed by $Ba_{2.07}Eu_{0.13}Si_7O_{10.2}N_4$, mixing is performed, by using an agate mortar and a pestle, to obtain a composition of 17.12 mass % of β type silicon nitride powder, 29.32 mass % of silicon oxide powder, 50.75 mass % of barium carbonate powder, and 2.81 mass % of europium oxide powder, whereby 50 g of powder mixture is obtained. The obtained powder mixture is mixed in ethanol by means of a rolling ball mill that uses an agate ball and a nylon pot to obtain a slurry.

The obtained slurry is dried at 100° C. by means of an oven; the obtained powder aggregate is smashed by means of a dry rolling ball mill that uses an agate ball and a nylon pot, whereby micro-particles having about 10 μm in diameter are obtained. The obtained micro-particles are filled into an aluminum crucible; a slight load is exerted to perform compression molding, thereafter, is calcined under a condition of 1100° C. for 3 hours in the air; the obtained calcined body is smashed by means of an agate mortar to obtain a precursor sample.

Next, the crucible is set into a pressure electric furnace of graphite resistance heating type; the calcination atmosphere is vacuumed by a diffusion pump; the crucible is heated from a room temperature to 800° C. at a speed of 500° C. increments per hour; nitrogen having a purity of 99.999 volume % is introduced at 800° C. to obtain a pressure of 1 MPa; thereafter, the crucible is raised to 1300° C. in 500° C. increments per hour, further kept at the temperature for 2 hours to obtain a fluorescent material sample. The obtained calcined matter is smashed by means of an agate mortar, filled again into the aluminum crucible; a slight load is exerted to perform the compression molding, thereafter, is calcined under a condition of 1300° C. for 48 hours in the nitrogen atmosphere; the obtained calcined substance is smashed by means of an agate mortar to obtain a fluorescent material powder.

Applying the powder X ray diffraction measurement (XRD) to the obtained fluorescent material powder by using K α rays of Cu, all the obtained charts show that the fluorescent material powder has a BSON structure. Besides, as a result of casting light onto the fluorescent material powder by means of a lamp that emits light having a wavelength of 365 nm, it is confirmed that green color light is emitted.

Figure 6:
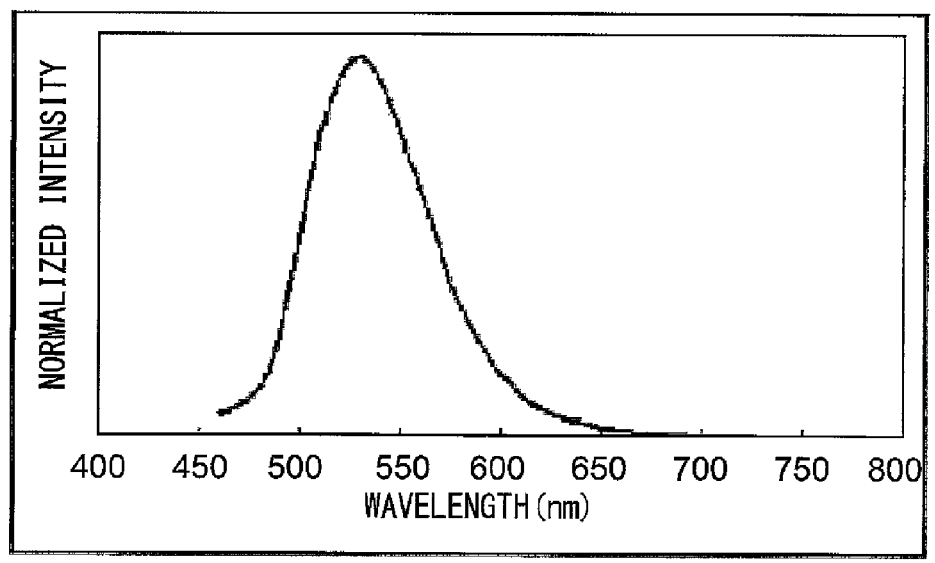
FIG. 6 is a graph showing a light emission spectrum of a fluorescent material obtained in a production example 2-3.

As a result of measuring a light emission spectrum when exciting, by means of the light of 450 nm, the powder of the obtained Eu-activated BSON fluorescent material by using the F-4500 (from Hitachi, Ltd.), the light emission spectrum shown in FIG. 6 is obtained. In FIG. 6, the vertical axis is the light emission intensity (arbitrary unit), while the horizontal axis is the wavelength (nm). As to the chromaticity coordinates of the light emission spectrum shown in FIG. 6, (x, y)=(0.287, 0.623), the peak wavelength is 528 nm, and the half width is 69 nm. Besides, the light absorptivity at a wavelength of 600 nm, which is measured by using the MCPD-7000 (from Otsuka Electronics Co., Ltd.), is 8.2%.

Besides, the internal quantum efficiency of the fluorescent material shown in the present production example 1, which is measured by a measurement system obtained by combining the MCPD-7000 and an integrating sphere with each other, is 72%.

Production Example 2-4: Adjustment of Green Fluorescent Material (Ce-Activated $Lu_3Al_5O_{12}$ $((Lu_{3-x}Ce_x)Al_5O_{12}))$ To obtain an fluorescent material having a composition formula expressed by $Lu_{2.7}Ce_{0.3}Al_5O_{12}$, weighing is performed in the air to obtain a predetermined composition of 63.7 weight % of $Lu_2O_3$ powder, 6.1 weight % of $CeO_2$ powder, and 30.2 weight % of $Al_2O_3$ powder, further, as a calcination assistant, a predetermined amount of $BaF_2$ is added; mixing is performed by means of a rolling ball mill that uses an agate ball and a nylon pot to obtain a powder mixture. The obtained mixture is filled into a quartz crucible, calcined under a condition of 1400° C. for 5 hours in a reduction atmosphere of $N_2$ (95%)+$H_2$ (5%); the obtained calcined substance is smashed by means of an agate mortar to obtain a fluorescent material powder.

As a result of casting light onto the obtained Ce-activated $Lu_3Al_5O_{12}$ fluorescent material powder by means of a lamp that emits light having a wavelength of 365 nm, it is confirmed that green color light is emitted. As a result of measuring a light emission spectrum of the powder, the light emission spectrum shown in FIG. 7 is obtained.

Figure 7:
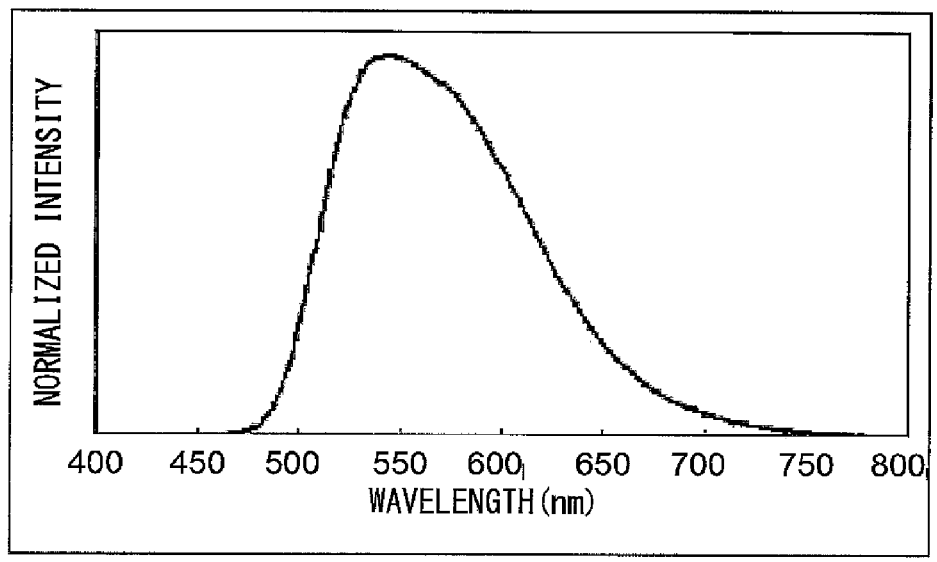
FIG. 7 is a graph showing a light emission spectrum of a fluorescent material obtained in a production example 2-4.

In FIG. 7, the vertical axis is the light emission intensity (arbitrary unit), while the horizontal axis is the wavelength (nm). As to the chromaticity coordinates of the light emission spectrum shown in FIG. 7, (x, y)=(0.420, 0.554), the peak wavelength is 540 nm, and the half width is 110 nm. Besides, the light absorptivity at a wavelength of 600 nm, which is measured by using the MCPD-7000 (from Otsuka Electronics Co., Ltd.), is 9.3%.

Besides, the internal quantum efficiency of the fluorescent material shown in the present production example 2-4, which is measured by a measurement system obtained by combining the MCPD-7000 and an integrating sphere with each other, is 73%.

Comparative Production Example 1: Production of Eu-Activated α SiAlON Fluorescent Material To obtain a fluorescent material in which x=0.75, y=0.08, m=1.67, n=0.95 in the composition formula $(Ca_xEu_y)$ $(Si_{12-(m+n)}Al_{m+n})$ $(O_nN_{16-n})$, weighing is performed to obtain, as raw material powders, 69.0 mass % of a type silicon nitride powder, 16.9 mass % of aluminum nitride power, 11.8 mass % of calcium carbonate powder, and 2.3 mass % of europium oxide powder, and mixing is performed for 10 minutes or more by using a mortar and pestle formed of silicon nitride sintered body to obtain a powder aggregate.

The obtained powder aggregate is made to pass through a sieve having an aperture of 250 μm and filled into a crucible that has a size of 20 mm in diameter, 20 mm in height and is formed of boron nitride. In the meantime, all the respective processes of the weighing, mixing, and forming of the powder are performed in a glove compartment that is able to hold a nitrogen atmosphere that contains water of 1 ppm or smaller and oxygen of 1 ppm or smaller.

Next, the crucible is set into a pressure electric furnace of graphite resistance heating type; nitrogen having a purity of 99.999 volume % is introduced to obtain a pressure of 1 MPa; a heat treatment is performed such that the crucible is raised to 1800° C. in 500° C. increments per hour; further kept at 1800° C. for 2 hours. A product obtained by the heat treatment is smashed by means of an agate mortar, further, treated in a 1:1 mixed acid of 50% of hydrofluoric acid and 96% of concentrated sulfuric acid, whereby a fluorescent material powder is obtained. Applying the powder X ray diffraction measurement (XRD) to the obtained fluorescent material powder by using K α rays of Cu, it is found out that the fluorescent material powder has an α SiAlON crystal structure. Besides, as a result of casting light onto the fluorescent material powder by means of a lamp that emits light having a wavelength of 365 nm, it is confirmed that orange color light is emitted.

Figure 8A:
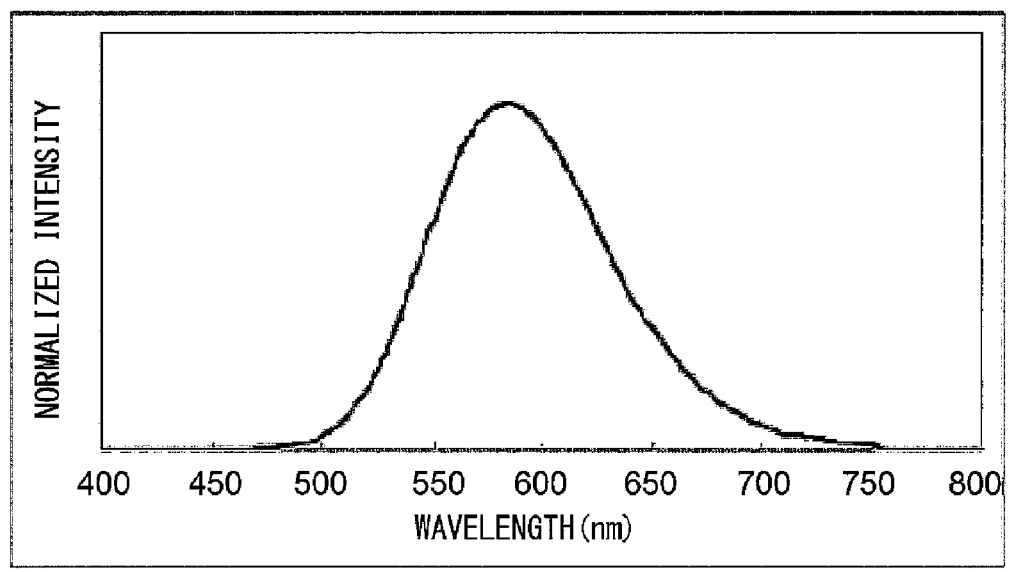
FIG. 8A is a graph showing a light emission spectrum of a fluorescent material obtained in a comparative production example 1.

FIG. 8A is a graph showing a light emission spectrum of the obtained fluorescent material powder; the vertical axis is the relative light emission intensity (arbitrary unit), while the horizontal axis is the wavelength (nm). Besides, FIG. 8B is a graph showing an excitation spectrum of the obtained fluorescent material powder; the vertical axis is the relative light emission intensity (arbitrary unit), while the horizontal axis is the wavelength (nm).

Figure 8B:
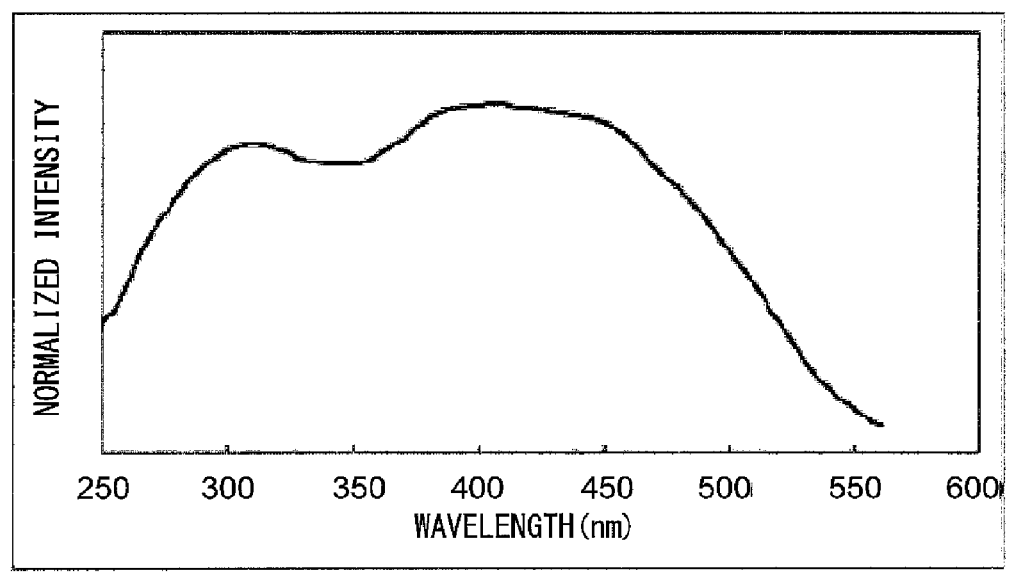
FIG. 8B is a graph showing an excitation spectrum of the fluorescent material obtained in the comparative production example 1.

In the meantime, the excitation spectrum and light emission spectrum of the fluorescent material powder shown in FIG. 8A and FIG. 8B are results of measurement using the F-4500 (from Hitachi, Ltd.). The light emission spectrum is measured by performing the excitation by means of light of 450 nm, while the excitation spectrum is measured by scanning the intensity of the light emission peak. As to the chromaticity coordinates of the light emission spectrum shown in FIG. 8A, (x, y)=(0.509, 0.484), the peak wavelength is 585 nm, and the half width is 94 nm.

Besides, the internal quantum efficiency of the fluorescent material shown in the present production example 1, which is measured by a measurement system obtained by combining the MCPD-7000 and an integrating sphere with each other, is 73%.

Comparative Production Example 2: Production of Eu-Activated $CaAlSiN_3$ Fluorescent Material To obtain a fluorescent material having a composition formula expressed by $Ca_{0.992}Eu_{0.008}SiAlN_3$, weighing is performed to obtain 29.7 mass % of aluminum nitride power, 33.9 mass % of α type silicon nitride powder, 35.6 mass % of calcium nitride powder, and 0.8 mass % of europium nitride powder, and mixing is performed for 10 minutes or more by using a mortar and pestle formed of silicon nitride sintered body to obtain a powder aggregate. As the europium nitride, a synthetic, which is synthesized by nitriding metal europium in ammonia, is used. This powder aggregate is made to free-fall into a crucible formed of boron nitride that has a size of 20 mm in diameter, 20 mm in height. In the meantime, all the respective processes of the weighing, mixing, and forming of the powder are performed in a glove compartment that is able to hold a nitrogen atmosphere that contains water of 1 ppm or smaller and oxygen of 1 ppm or smaller.

Next, the crucible is set into a pressure electric furnace of graphite resistance heating type; nitrogen having a purity of 99.999 volume % is introduced to obtain a pressure of 1 MPa; the crucible is raised to 1800° C. in 500° C. increments per hour, further kept at 1800° C. for 2 hours to obtain a fluorescent material sample. The obtained fluorescent material sample is smashed by means of an agate mortar to obtain a fluorescent material powder. Applying the powder X ray diffraction measurement (XRD) to the obtained fluorescent material powder by using K α rays of Cu, it is found out that the fluorescent material powder has a $CaAlSiN_3$ crystal structure. Besides, as a result of casting light onto the fluorescent material powder by means of a lamp that emits light having a wavelength of 365 nm, it is confirmed that red color light is emitted.

Figure 9:
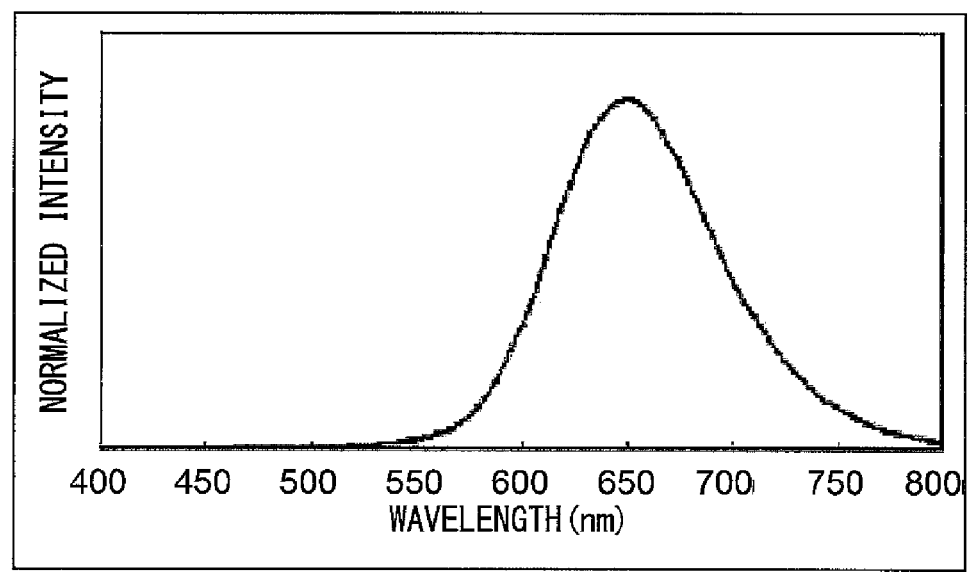
FIG. 9 is a graph showing a light emission spectrum of a fluorescent material obtained in a comparative production example 2.
Figure 10:
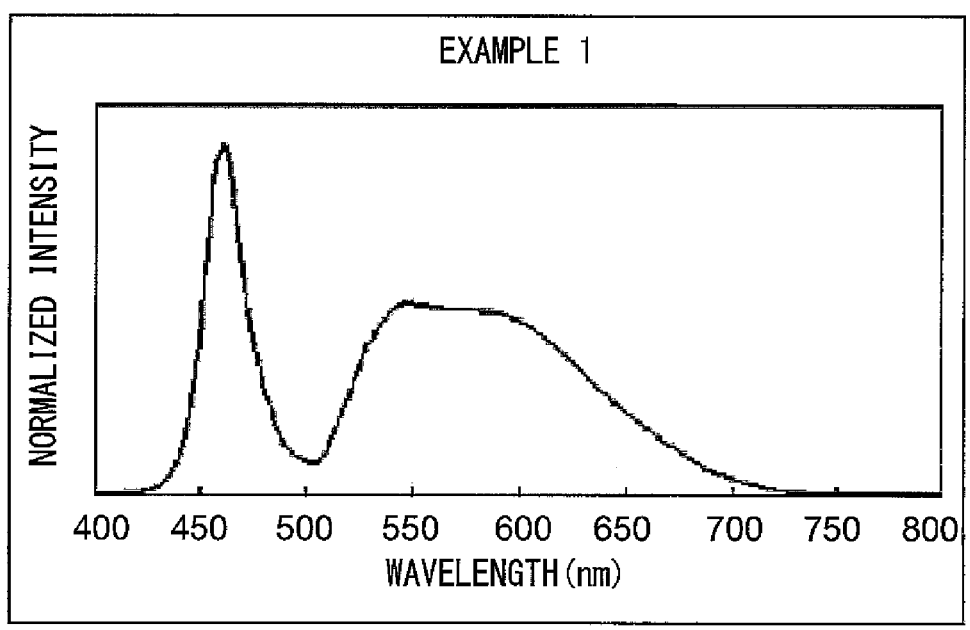
FIG. 10 is a graph showing a light emission spectrum of a light-emitting device obtained in an example 1.
Figure 11:
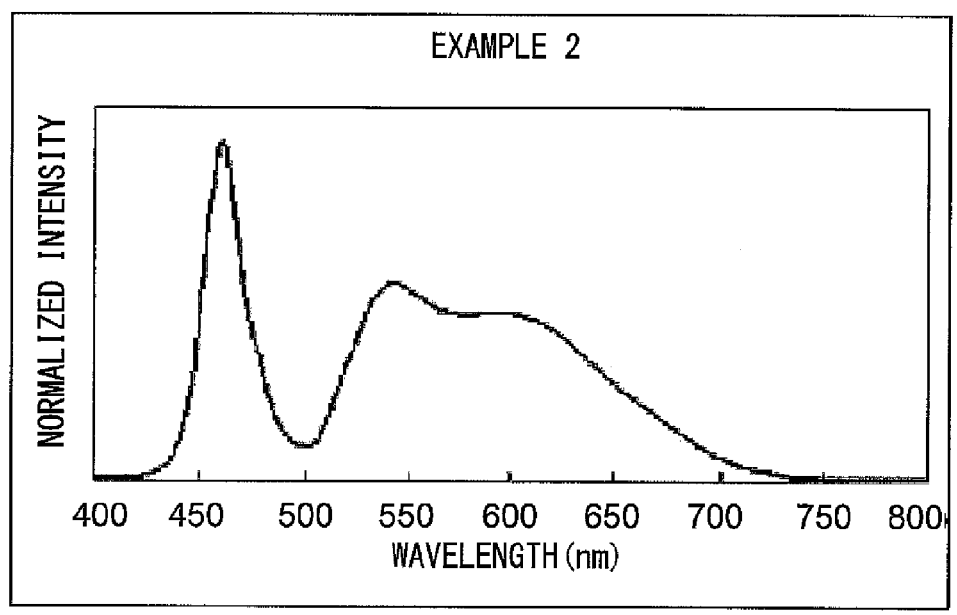
FIG. 11 is a graph showing a light emission spectrum of a light-emitting device obtained in an example 2.
Figure 12:
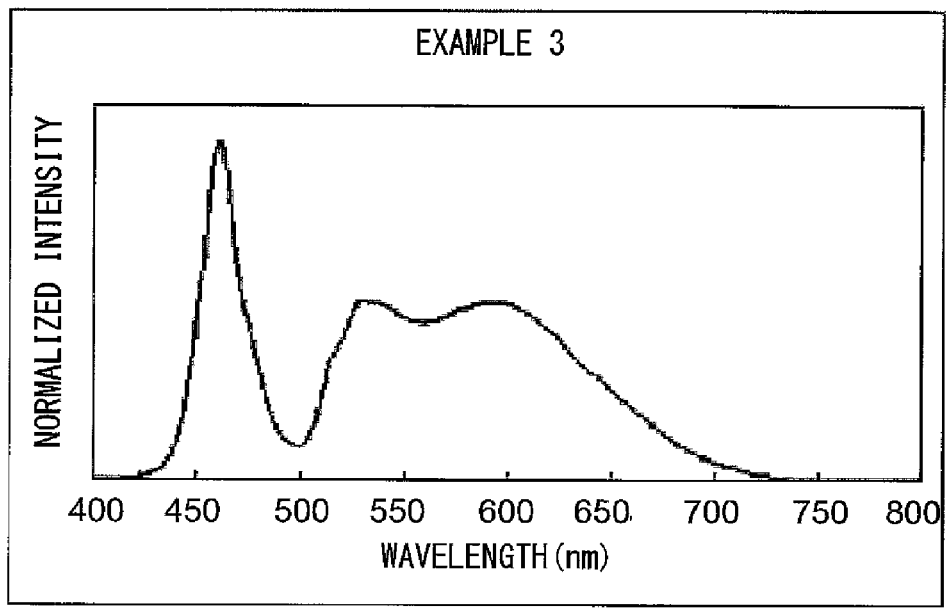
FIG. 12 is a graph showing a light emission spectrum of a light-emitting device obtained in an example 3.
Figure 13:
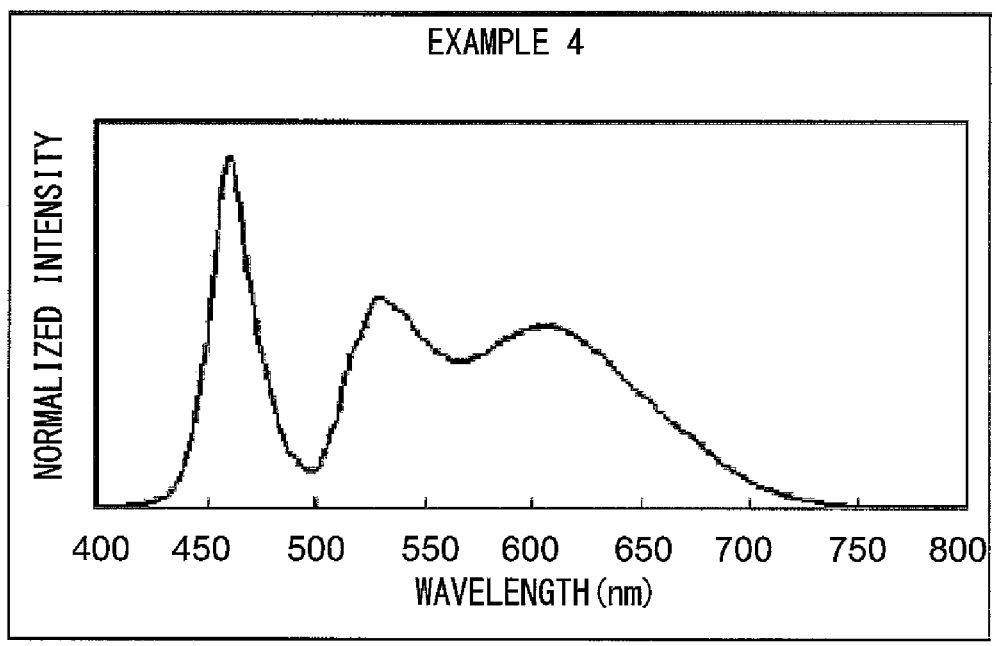
FIG. 13 is a graph showing a light emission spectrum of a light-emitting device obtained in an example 4.
Figure 14:
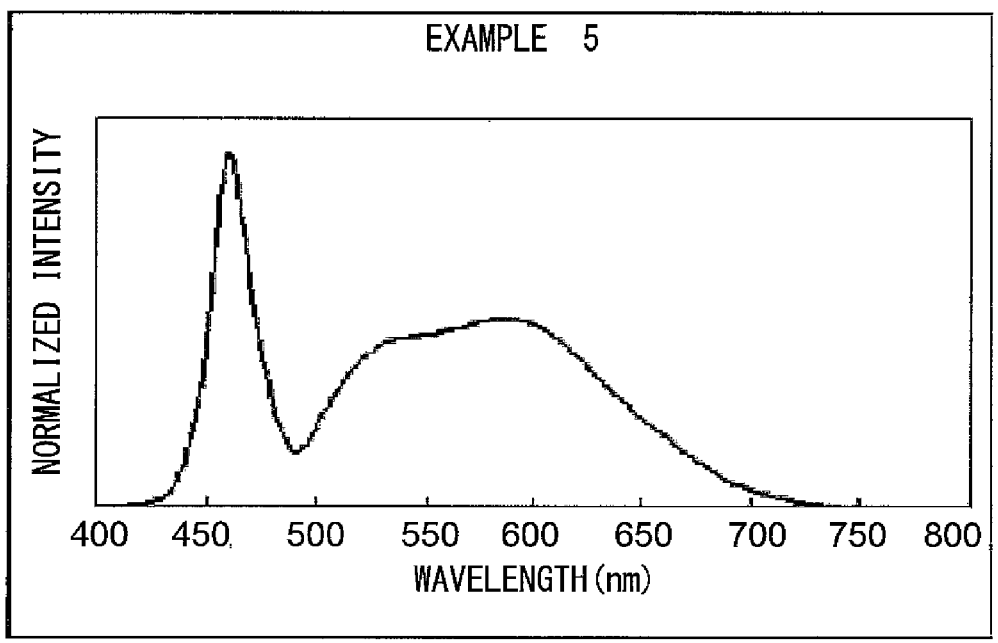
FIG. 14 is a graph showing a light emission spectrum of a light-emitting device obtained in an example 5.
Figure 15:
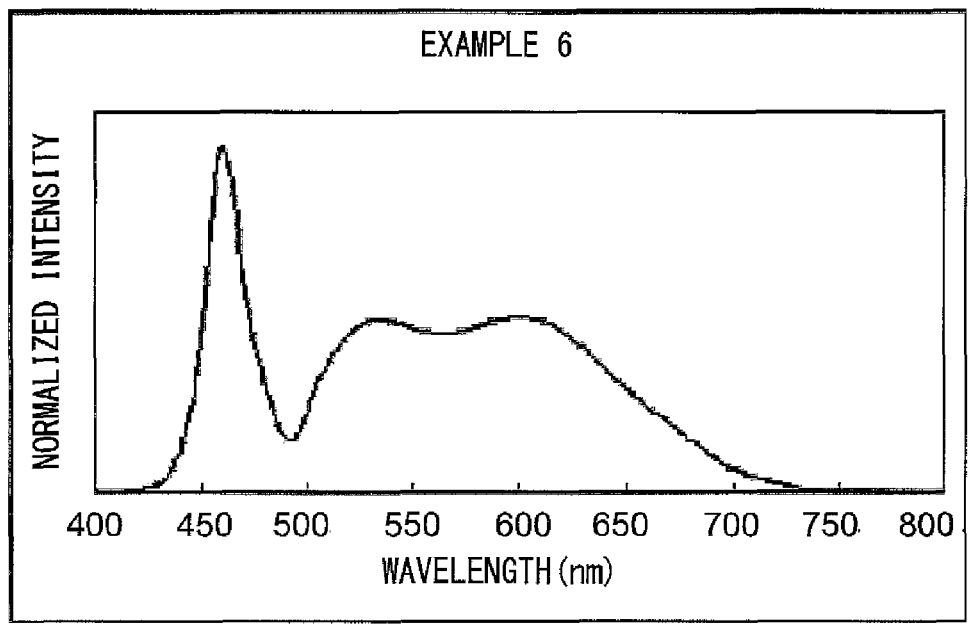
FIG. 15 is a graph showing a light emission spectrum of a light-emitting device obtained in an example 6.
Figure 16:
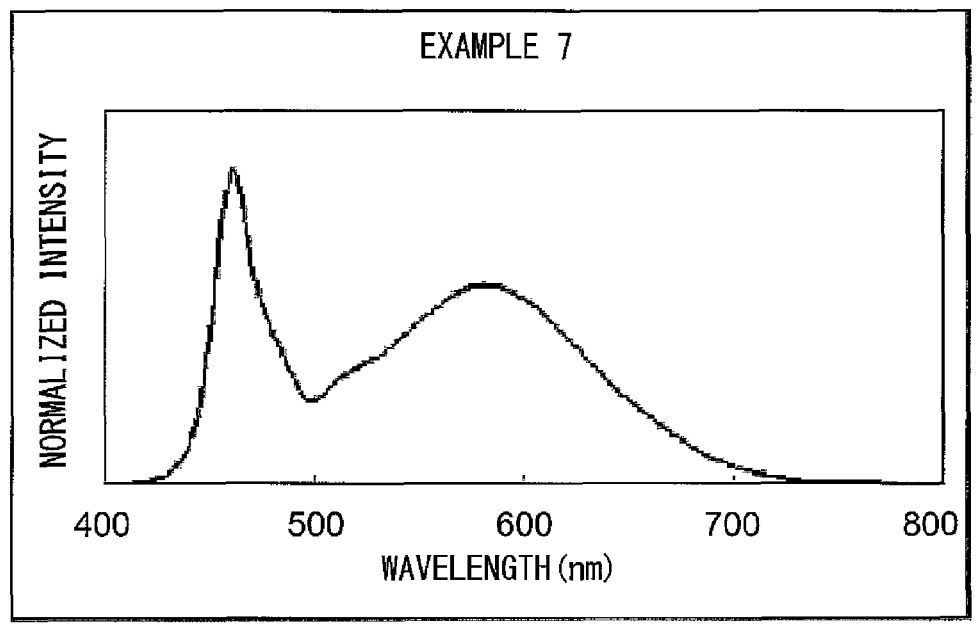
FIG. 16 is a graph showing a light emission spectrum of a light-emitting device obtained in an example 7.
Figure 17:
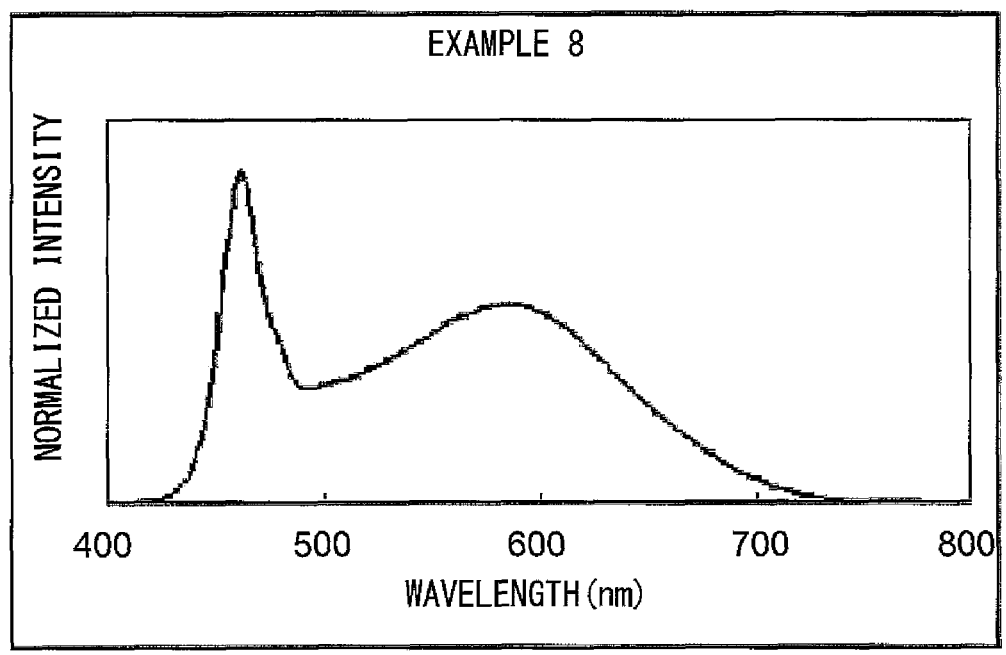
FIG. 17 is a graph showing a light emission spectrum of a light-emitting device obtained in an example 8.
Figure 18:
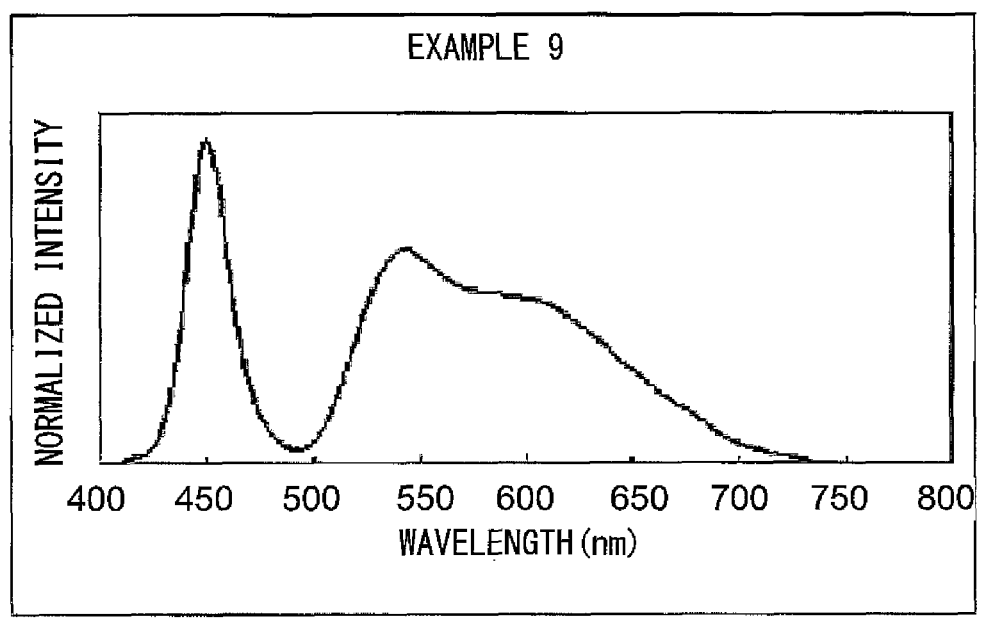
FIG. 18 is a graph showing a light emission spectrum of a light-emitting device obtained in an example 9.
Figure 19:
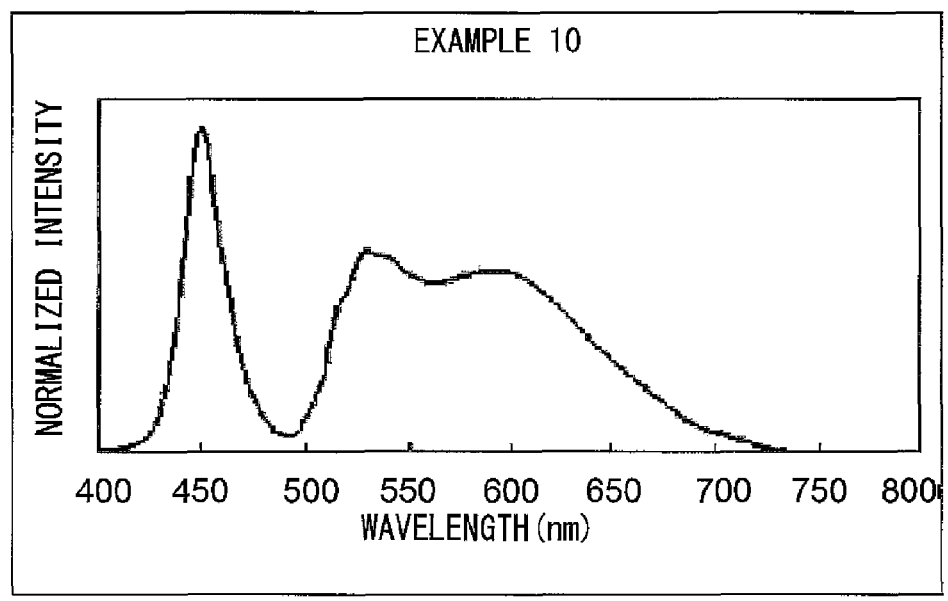
FIG. 19 is a graph showing a light emission spectrum of a light-emitting device obtained in an example 10.
Figure 20:
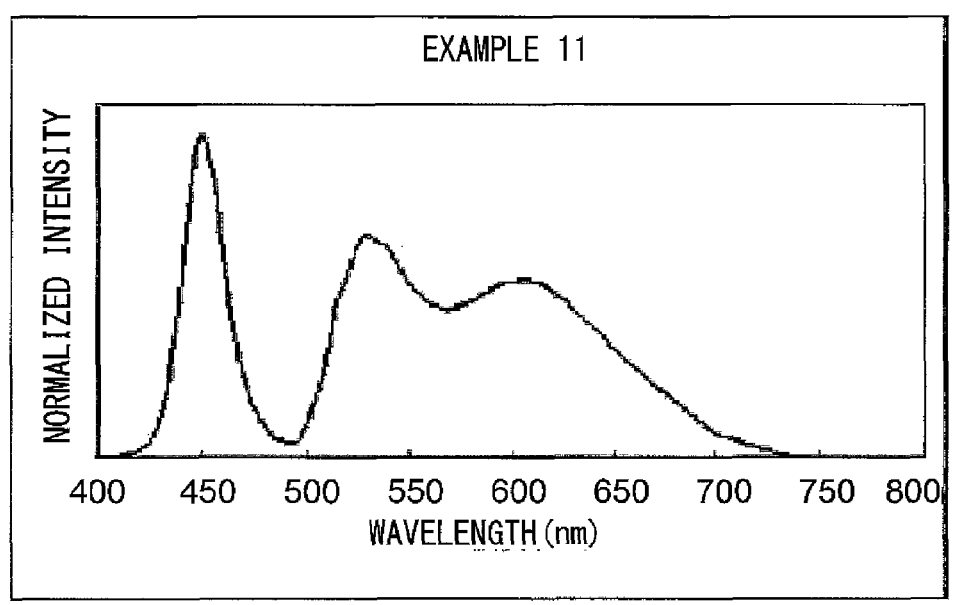
FIG. 20 is a graph showing a light emission spectrum of a light-emitting device obtained in an example 11.
Figure 21:
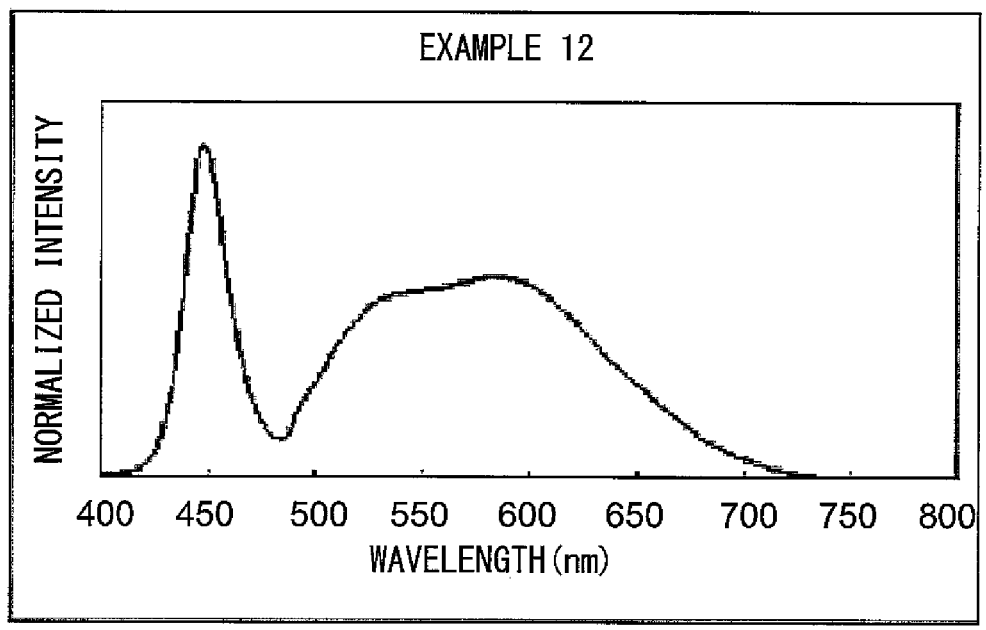
FIG. 21 is a graph showing a light emission spectrum of a light-emitting device obtained in an example 12.
Figure 22:
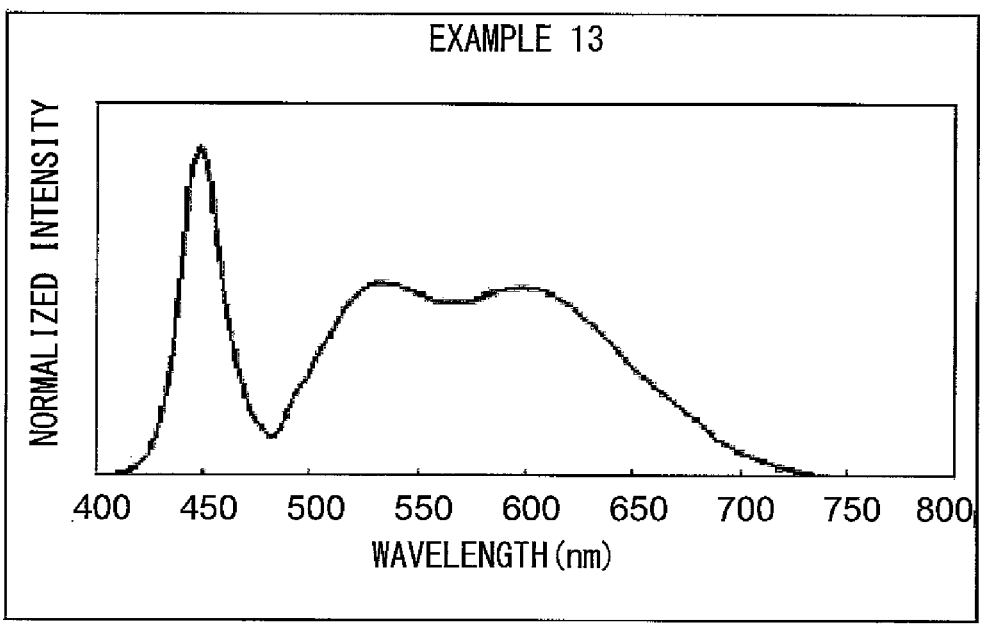
FIG. 22 is a graph showing a light emission spectrum of a light-emitting device obtained in an example 13.
Figure 23:
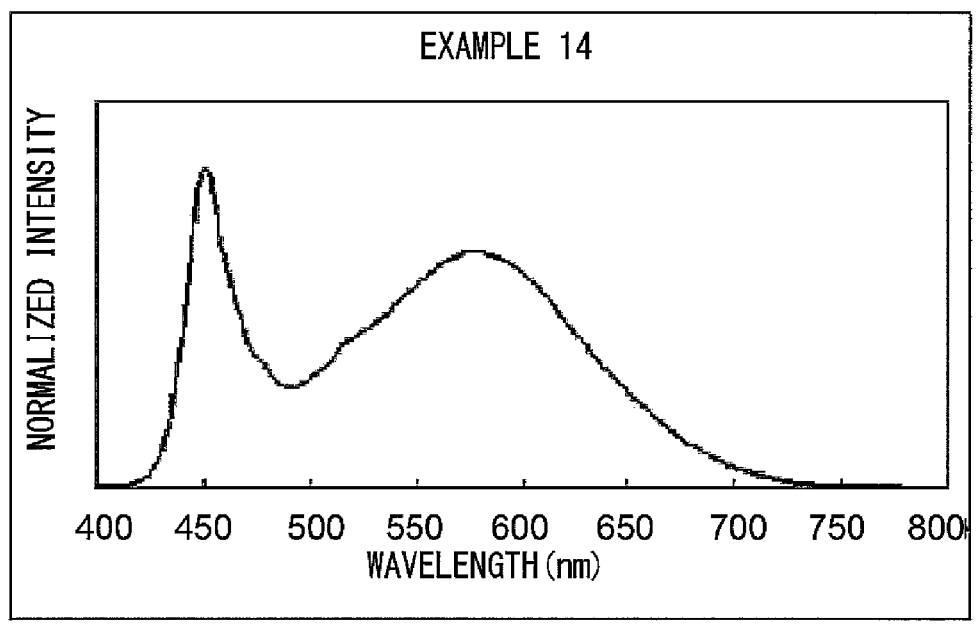
FIG. 23 is a graph showing a light emission spectrum of a light-emitting device obtained in an example 14.
Figure 24:
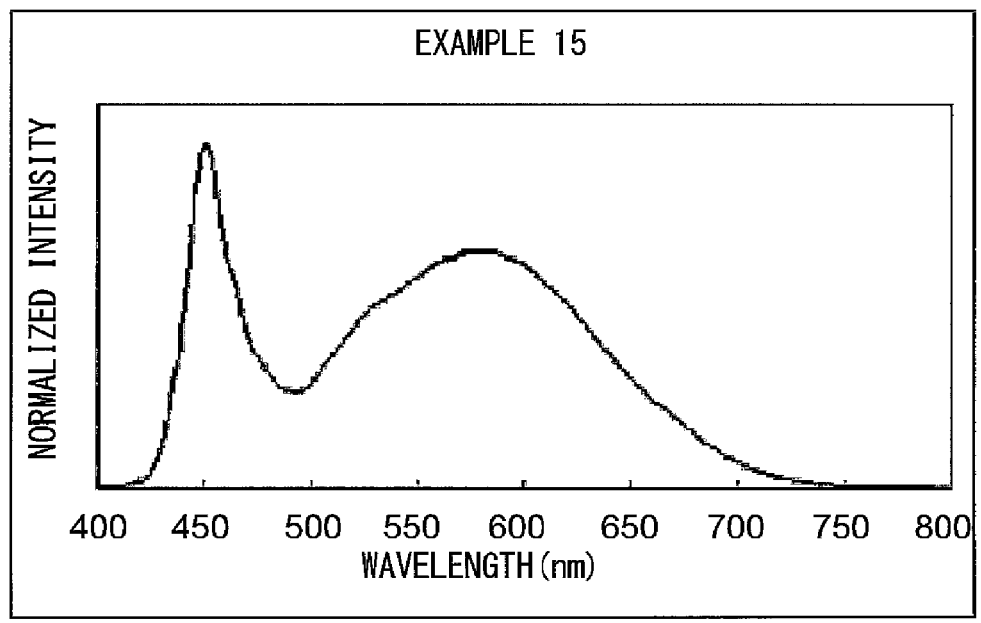
FIG. 24 is a graph showing a light emission spectrum of a light-emitting device obtained in an example 15.
Figure 25:
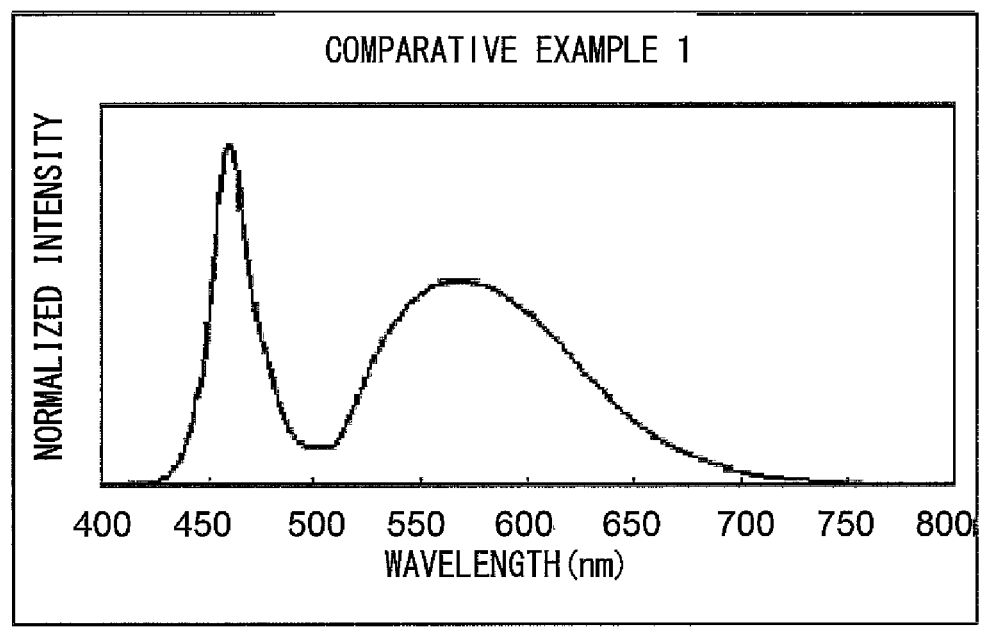
FIG. 25 is a graph showing a light emission spectrum of a light-emitting device obtained in a comparative example 1.
Figure 26:
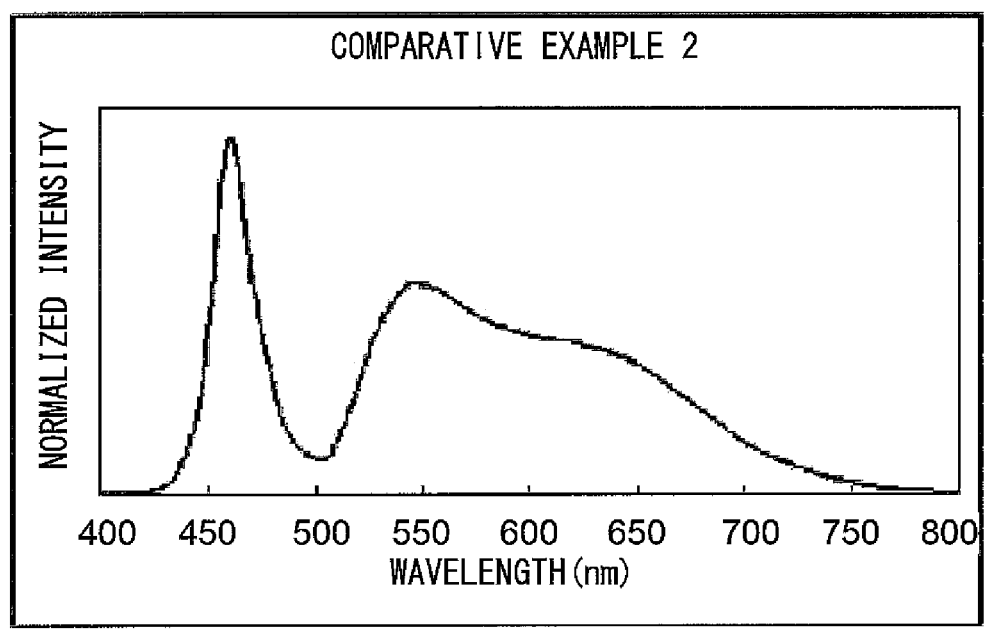
FIG. 26 is a graph showing a light emission spectrum of a light-emitting device obtained in a comparative example 2.
Figure 27:
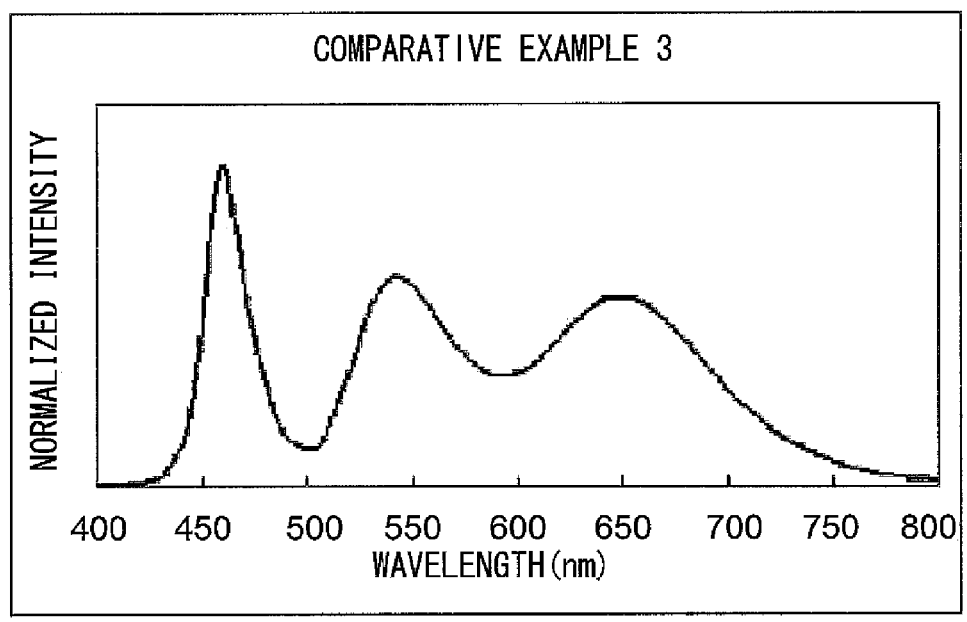
FIG. 27 is a graph showing a light emission spectrum of a light-emitting device obtained in a comparative example 3.
Figure 28:
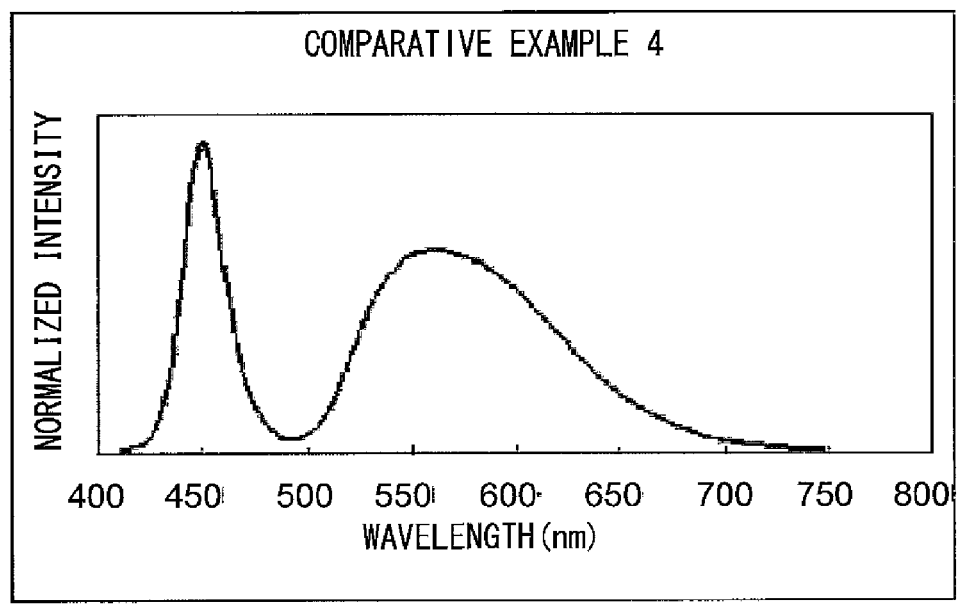
FIG. 28 is a graph showing a light emission spectrum of a light-emitting device obtained in a comparative example 4.
Figure 29:
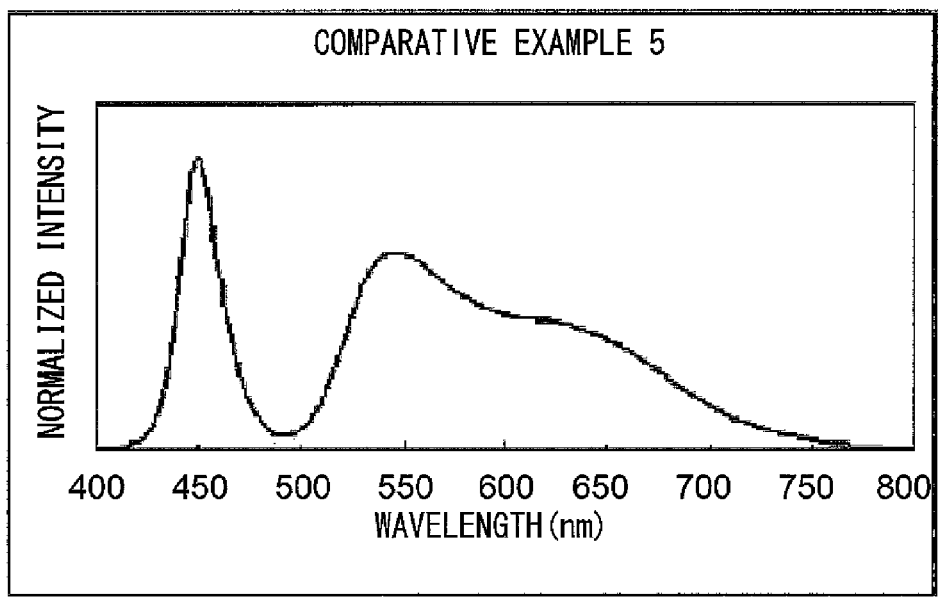
FIG. 29 is a graph showing a light emission spectrum of a light-emitting device obtained in a comparative example 5.
Figure 30:
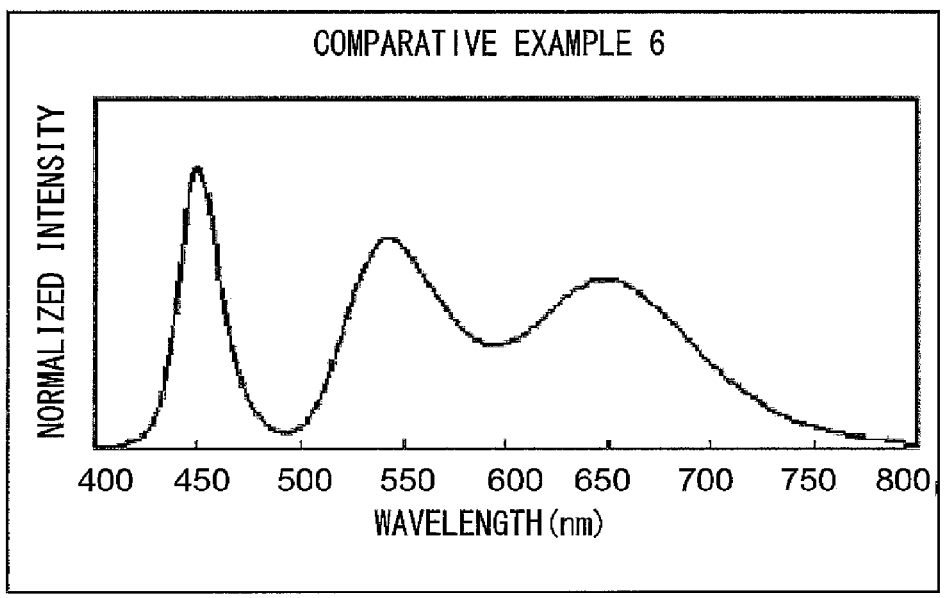
FIG. 30 is a graph showing a light emission spectrum of a light-emitting device obtained in a comparative example 6.

FIG. 9 is a graph showing a light emission spectrum of the obtained fluorescent material powder; the vertical axis is the relative light emission intensity (arbitrary unit), while the horizontal axis is the wavelength (nm). The light emission spectrum when exciting, by means of the light of 450 nm, the fluorescent material powder shown in FIG. 9 are results of measurement using the F-4500 (from Hitachi, Ltd.). As to the chromaticity coordinates of the light emission spectrum shown in FIG. 9, (x, y)=(0.657, 0.340), the peak wavelength is 649 nm, and the half width is 90 nm.

Besides, the internal quantum efficiency of the fluorescent material shown in the present comparative production example 2, which is measured by a measurement system obtained by combining the MCPD-7000 and an integrating sphere with each other, is 80%.

[2] Production of Semiconductor Light-Emitting Device

Examples 1 to 15

A silicone resin (product name: the KER2500, Shin-Etsu Chemical Co., Ltd.) is used, each fluorescent material shown in a table 2 and the silicone resin are mixed and dispersed at mass ratios shown in a table 3 to produce mold resins, and a semiconductor light-emitting device for each example having the structure shown in FIG. 1 is produced.

In the meantime, as the semiconductor light-emitting element, an LED (product name: the EZR, Cree, Inc.) having a light emission peak wavelength shown in the table 2 is used, and respective ratios among the resin, the orange fluorescent material, and the green fluorescent material are suitably adjusted such that the color temperature of the light-emitting device is about 5000K.

TABLE 2

| | BLUE LED PEAK WAVELENGTH (nm) | ORANGE FLUORESCENT MATERIAL | GREEN FLUORESCENT MATERIAL | RED FLUORESCENT MATERIAL |
|---|---|---|---|---|
| EXAMPLE 1 | 460 | PRODUCTION EXAMPLE 1-1 | PRODUCTION EXAMPLE 2-1 | NOT USED |
| EXAMPLE 2 | 460 | PRODUCTION EXAMPLE 1-2 | PRODUCTION EXAMPLE 2-1 | NOT USED |
| EXAMPLE 3 | 460 | PRODUCTION EXAMPLE 1-1 | PRODUCTION EXAMPLE 2-2 | NOT USED |
| EXAMPLE 4 | 460 | PRODUCTION EXAMPLE 1-2 | PRODUCTION EXAMPLE 2-2 | NOT USED |
| EXAMPLE 5 | 460 | PRODUCTION EXAMPLE 1-1 | PRODUCTION EXAMPLE 2-3 | NOT USED |
| EXAMPLE 6 | 460 | PRODUCTION EXAMPLE 1-2 | PRODUCTION EXAMPLE 2-3 | NOT USED |
| EXAMPLE 7 | 460 | PRODUCTION EXAMPLE 1-1 | PRODUCTION EXAMPLE 2-4 | NOT USED |
| EXAMPLE 8 | 460 | PRODUCTION EXAMPLE 1-2 | PRODUCTION EXAMPLE 2-4 | NOT USED |
| EXAMPLE 9 | 450 | PRODUCTION EXAMPLE 1-2 | PRODUCTION EXAMPLE 2-1 | NOT USED |
| EXAMPLE 10 | 450 | PRODUCTION EXAMPLE 1-1 | PRODUCTION EXAMPLE 2-2 | NOT USED |
| EXAMPLE 11 | 450 | PRODUCTION EXAMPLE 1-2 | PRODUCTION EXAMPLE 2-2 | NOT USED |
| EXAMPLE 12 | 450 | PRODUCTION EXAMPLE 1-1 | PRODUCTION EXAMPLE 2-3 | NOT USED |
| EXAMPLE 13 | 450 | PRODUCTION EXAMPLE 1-2 | PRODUCTION EXAMPLE 2-3 | NOT USED |
| EXAMPLE 14 | 450 | PRODUCTION EXAMPLE 1-1 | PRODUCTION EXAMPLE 2-4 | NOT USED |
| EXAMPLE 15 | 450 | PRODUCTION EXAMPLE 1-2 | PRODUCTION EXAMPLE 2-4 | NOT USED |
| COMPARATIVE EXAMPLE 1 | 460 | COMPARATIVE PRODUCTION EXAMPLE 1 | PRODUCTION EXAMPLE 2-1 | NOT USED |
| COMPARATIVE EXAMPLE 2 | 460 | COMPARATIVE PRODUCTION EXAMPLE 1 | PRODUCTION EXAMPLE 2-1 | COMPARATIVE PRODUCTION EXAMPLE 2 |
| COMPARATIVE EXAMPLE 3 | 460 | NOT USED | PRODUCTION EXAMPLE 2-1 | COMPARATIVE PRODUCTION EXAMPLE 2 |
| COMPARATIVE EXAMPLE 4 | 450 | COMPARATIVE PRODUCTION EXAMPLE 1 | PRODUCTION EXAMPLE 2-1 | NOT USED |
| COMPARATIVE EXAMPLE 5 | 450 | COMPARATIVE PRODUCTION EXAMPLE 1 | PRODUCTION EXAMPLE 2-1 | COMPARATIVE PRODUCTION EXAMPLE 2 |
| COMPARATIVE EXAMPLE 6 | 450 | NOT USED | PRODUCTION EXAMPLE 2-1 | COMPARATIVE PRODUCTION EXAMPLE 2 |

TABLE 3

| | RESIN/FLUORESCENT MATERIAL RATIO | GREEN FLUORESCENT MATERIAL/ORANGE FLUORESCENT MATERIAL RATIO | GREEN FLUORESCENT MATERIAL/RED FLUORESCENT MATERIAL RATIO |
|---|---|---|---|
| EXAMPLE 1 | 11.25 | 1.38 | 0.00 |
| EXAMPLE 2 | 10.66 | 1.51 | 0.00 |
| EXAMPLE 3 | 11.44 | 1.18 | 0.00 |
| EXAMPLE 4 | 10.92 | 1.28 | 0.00 |
| EXAMPLE 5 | 8.88 | 1.91 | 0.00 |
| EXAMPLE 6 | 8.12 | 2.20 | 0.00 |
| EXAMPLE 7 | 7.42 | 1.75 | 0.00 |
| EXAMPLE 8 | 7.14 | 2.52 | 0.00 |
| EXAMPLE 9 | 9.94 | 1.65 | 0.00 |
| EXAMPLE 10 | 10.69 | 1.26 | 0.00 |
| EXAMPLE 11 | 10.24 | 1.36 | 0.00 |
| EXAMPLE 12 | 7.64 | 2.25 | 0.00 |
| EXAMPLE 13 | 6.95 | 2.60 | 0.00 |
| EXAMPLE 14 | 6.85 | 2.25 | 0.00 |
| EXAMPLE 15 | 6.49 | 3.03 | 0.00 |

TABLE 3-continued

| | RESIN/FLUORESCENT MATERIAL RATIO | GREEN FLUORESCENT MATERIAL/ORANGE FLUORESCENT MATERIAL RATIO | GREEN FLUORESCENT MATERIAL/RED FLUORESCENT MATERIAL RATIO |
|---|---|---|---|
| COMPARATIVE EXAMPLE 1 | 12.42 | 0.97 | 0.00 |
| COMPARATIVE EXAMPLE 2 | 12.42 | 1.89 | 7.87 |
| COMPARATIVE EXAMPLE 3 | 15.28 | 0.00 | 4.00 |
| COMPARATIVE EXAMPLE 4 | 11.33 | 1.13 | 0.00 |
| COMPARATIVE EXAMPLE 5 | 11.49 | 2.13 | 8.50 |
| COMPARATIVE EXAMPLE 6 | 14.14 | 0.00 | 4.47 |

FIGS. 10 to 24 show light emission spectra of the respective light-emitting devices in the examples 1 to 15. In the meantime, the light emission spectra shown in FIGS. 10 to 24 are measured by using the MCPD-7000 (from Otsuka Electronics Co., Ltd.).

Example 16

A silicone resin (product name: the KER2500, Shin-Etsu Chemical Co., Ltd.) is used, each fluorescent material shown in a table 4 and the silicone resin are mixed and dispersed at mass ratios shown in the table 4 to produce a mold resin, and a semiconductor light-emitting device for the example 16 s produced.

In the meantime, in the example 16, as the semiconductor light-emitting element, an LED (product name: the EZR, Cree, Inc.) having a light emission peak wavelength at 450 nm is used, and the resin/fluorescent material ratio is suitably adjusted such that the chromaticity point approaches a black body locus when the color temperature of the light-emitting device is near 5000K.

A table 5 shows light-emitting properties of the respective light-emitting devices produced in the above example 16 and the above 9, while a table 6 shows properties of the Eu-activated α SiAlON fluorescent material used. In the meantime, each index shown in the table 5 is calculated based on the spectrum measured by the MCPD-7000.

According to the table 5 and the table 6, as to the semiconductor light-emitting device shown in the example 9, the light emission property of the fluorescent material used is similar to the example 16, however, the color rendering property is improved. As shown in the table 6, it is conceivable this is because the particle shapes such as the average particle diameter, specific surface area and the like of the Eu-activated α SiAlON fluorescent material that is the orange fluorescent material are different.

The Eu-activated α SiAlON fluorescent material produced in the production example 1-2 and used in the example 9, as shown in the table 6, is large in average particle diameter and small in specific surface area compared with the Eu-activated α SiAlON fluorescent material produced in the production example 1-3 and used in the example 16. More specifically, the Eu-activated α SiAlON fluorescent material produced in the production example 1-2 has an average particle diameter of 15.3 μm and a specific surface area of 0.38 $m^2/g$, while the Eu-activated α SiAlON fluorescent material produced in the production example 1-3 has an average particle diameter of 11.2 μm and a specific surface area of 0.78 $m^2/g$. Therefore, as to the Eu-activated α SiAlON fluorescent material produced in the production example 1-2, it is conceivable that the dispersion state in the mold resin is different from the Eu-activated α SiAlON fluorescent material produced in the production example 1-3.

When the dispersion state of the Eu-activated α SiAlON fluorescent material in the mold resin is different, the scattering and absorption states of the orange fluorescent material for the blue light and green light change. It is conceivable that this change has an influence on the light emission spectrum of the light-emitting device and improves the color rendering property of the semiconductor light-emitting device shown in the example 9.

Accordingly, to improve the color rendering property, it is preferable that the average particle diameter of the Eu-activated α SiAlON fluorescent material is 15 μm or more, and it is preferable that the specific surface area is 0.4 $m^2/g$ or smaller. Besides, generally, the small specific surface area means that the particle diameters of the individual particles composing the fluorescent material are large and the uniformity of the crystal is high; when the uniformity of the crystal is high, the luminous efficiency of the fluorescent material rises. Therefore, making the specific surface area small to 0.4 $m^2/g$ or smaller contributes to the improvement of the luminous efficiency as well.

TABLE 4

| | ORANGE FLUORESCENT MATERIAL | GREEN FLUORESCENT MATERIAL | RESIN/ FLUORESCENT MATERIAL RATIO | GREEN FLUORESCENT MATERIAL/ ORANGE FLUORESCENT MATERIAL RATIO |
|---|---|---|---|---|
| EXAMPLE 16 | PRODUCTION EXAMPLE1-3 | PRODUCTION EXAMPLE2-1 | 13.07 | 1.20 |

TABLE 5

| | BLUE LED PEAK WAVELENGTH (nm) | Ra = | R9 = | TCP = | Duv = | x = | y = | R10 = | R11 = | R12 = | R13 = | R14 = | R15 = |
|---|---|---|---|---|---|---|---|---|---|---|---|---|---|
| EXAMPLE 9 | 450 | 72.6 | 3.6 | 5010.9 | −0.1 | 0.345 | 0.351 | 35.6 | 70.0 | 32.6 | 74.2 | 81.5 | 73.6 |
| EXAMPLE 16 | 450 | 69.4 | −107 | 5013.7 | −0.1 | 0.345 | 0.351 | 30.6 | 62.0 | 27.6 | 69.9 | 81.5 | 69.4 |

TABLE 6

| | Eu-ACTIVATED α SiAlON | | | | Eu-ACTIVATED β SiAlON | | | |
|---|---|---|---|---|---|---|---|---|
| | PRODUCTION EXAMPLE | LIGHT EMISSION SPECTRUM PEAK WAVELENGTH (nm) | SPECIFIC SURFACE AREA (m²/g) | AVERAGE PARTICLE DIAMETER (μm) | PRODUCTION EXAMPLE | LIGHT EMISSION SPECTRUM PEAK WAVELENGTH (nm) | SPECIFIC SURFACE AREA (m²/g) | AVERAGE PARTICLE DIAMETER (μm) |
| EXAMPLE 9 | PRODUCTION EXAMPLE 1-2 | 610 | 0.38 | 15.3 | PRODUCTION EXAMPLE 2-1 | 540 | 0.80 | 9.2 |
| EXAMPLE 16 | PRODUCTION EXAMPLE 1-3 | 610 | 0.78 | 11.2 | PRODUCTION EXAMPLE 2-1 | 540 | 0.80 | 9.2 |

Comparative Examples 1 to 6

A silicone resin (product name: the KER2500, Shin-Etsu Chemical Co., Ltd.) is used, and each fluorescent material shown in the table 2 and the silicone resin are mixed and dispersed at the mass ratios shown in the table 3 to produce mold resins, and semiconductor light-emitting devices for comparative examples 1 to 6 having the structure shown in FIG. 1 are produced.

In the meantime, as the semiconductor light-emitting element, the LED (product name: the EZR, Cree, Inc.) having the light emission peak wavelength shown in the table 2 is used, and respective ratios among the resin, the orange fluorescent material, the green fluorescent material and the red fluorescent material are suitably adjusted such that the color temperatures of the light-emitting devices approach 5000K. In the meantime, the comparative examples 1, 4 have a structure that does not include the red fluorescent material, and the comparative examples 3, 6 have a structure that does not include the orange fluorescent material. The comparative examples 2, 5 correspond to the example disclosed in the patent document 2.

FIGS. 25 to 30 show respective light emission spectra of the semiconductor light-emitting devices in the comparative examples 1 to 6. In the meantime, the light emission spectra shown in FIGS. 25 to 30 are measured by using the MCPD-7000 (from Otsuka Electronics Co., Ltd.).

Figure 31:
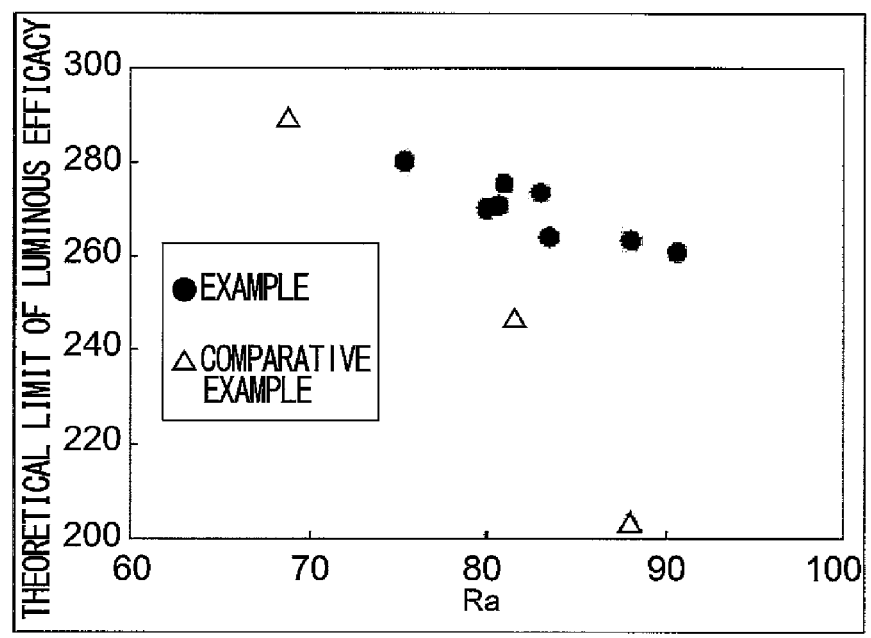
FIG. 31 is a graph showing a relationship between Ra and the theoretical limit efficiency of the semiconductor light-emitting devices produced in the examples 1 to 8 and produced in the comparative examples 1 to 3.
Figure 32:
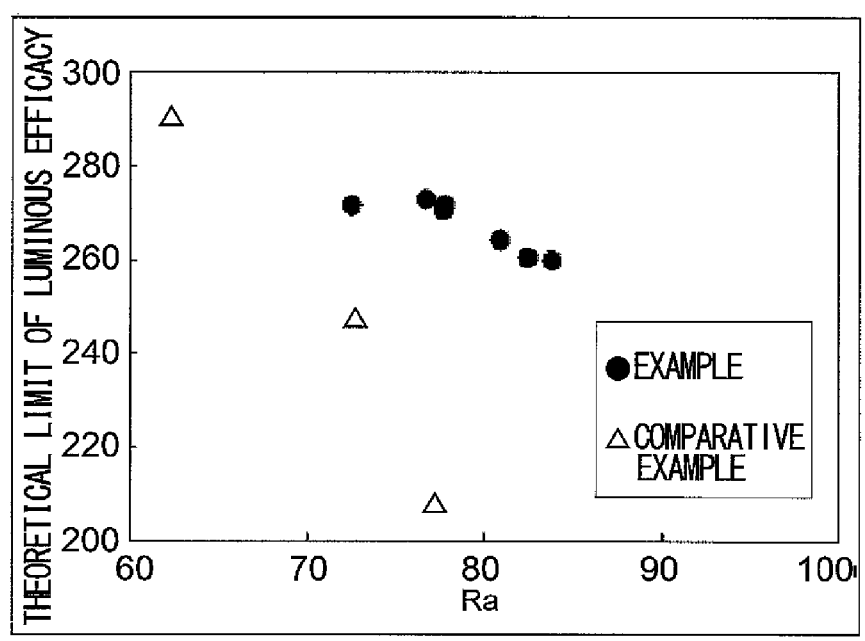
FIG. 32 is a graph showing a relationship between Ra and the theoretical limit efficiency of the semiconductor light-emitting devices produced in the examples 9 to 15 and produced in the comparative examples 4 to 6.

A table 7 shows light emission properties of the respective light-emitting devices produced in the above examples and comparative examples. In the meantime, each index shown in the table 7 is calculated based on the light emission spectra in FIG. 10 to FIG. 30. FIG. 31 shows a relationship between Ra and the theoretical limit of luminous efficacy related to the semiconductor light-emitting devices which are produced in the examples 1 to 8 and in the comparative examples 1 to 3 and in which the peak wavelength of the blue LED is 460 nm, FIG. 32 shows a relationship between Ra and the theoretical limit of luminous efficacy related to the semiconductor light-emitting devices which are produced in the examples 9 to 15 and in the comparative examples 4 to 6 and in which the peak wavelength of the blue LED is 450 nm.

TABLE 7

| | BLUE LED PEAK WAVELENGTH (nm) | THEORETICAL LIMIT OF LUMINOUS EFFICACY (lm/W) | Ra = | R9 = | TCP = | Duv = | x = |
|---|---|---|---|---|---|---|---|
| EXAMPLE 1 | 460 | 280.1 | 75.5 | −10.2 | 5021.3 | −0.4 | 0.344 |
| EXAMPLE 2 | 460 | 270.6 | 80.6 | 19.6 | 5011.1 | 0.3 | 0.345 |
| EXAMPLE 3 | 460 | 273.4 | 83.1 | 14.1 | 5021.1 | 0.2 | 0.345 |
| EXAMPLE 4 | 460 | 260.5 | 90.7 | 53.7 | 5013.9 | 0.1 | 0.345 |
| EXAMPLE 5 | 460 | 275.3 | 81.0 | 2.5 | 5058.5 | 0.5 | 0.344 |
| EXAMPLE 6 | 460 | 263.3 | 88.1 | 38.8 | 5048.1 | −0.1 | 0.344 |
| EXAMPLE 7 | 460 | 269.9 | 80.0 | −3.6 | 5060.4 | 0.5 | 0.344 |
| EXAMPLE 8 | 460 | 263.9 | 83.5 | 15.0 | 5033.0 | 0.0 | 0.344 |
| EXAMPLE 9 | 450 | 271.5 | 72.6 | 3.6 | 5010.9 | −0.1 | 0.345 |
| EXAMPLE 10 | 450 | 272.7 | 76.7 | 2.7 | 5029.9 | −0.1 | 0.344 |
| EXAMPLE 11 | 450 | 260.3 | 82.4 | 41.4 | 5036.1 | 0.1 | 0.344 |
| EXAMPLE 12 | 450 | 271.4 | 77.8 | −5.9 | 5018.0 | −0.1 | 0.345 |

TABLE 7-continued

| | | | | | | | |
|---|---|---|---|---|---|---|---|
| EXAMPLE 13 | 450 | 259.7 | 83.9 | 29.6 | 5032.1 | 0.0 | 0.344 |
| EXAMPLE 14 | 450 | 270.5 | 77.7 | −18.3 | 5030.3 | 0.0 | 0.344 |
| EXAMPLE 15 | 450 | 264.0 | 80.9 | 0.5 | 5037.5 | −0.4 | 0.344 |
| COMPARATIVE EXAMPLE 1 | 460 | 289.2 | 68.8 | −46.7 | 5036.8 | 0.3 | 0.344 |
| COMPARATIVE EXAMPLE 2 | 460 | 245.9 | 81.5 | 43.8 | 5004.1 | 0.4 | 0.345 |
| COMPARATIVE EXAMPLE 3 | 460 | 203.4 | 88.0 | 53.9 | 5071.4 | 0.0 | 0.343 |
| COMPARATIVE EXAMPLE 4 | 450 | 290.2 | 62.4 | −61.0 | 5042.2 | 0.0 | 0.344 |
| COMPARATIVE EXAMPLE 5 | 450 | 246.7 | 72.8 | 28.5 | 5008.7 | 0.2 | 0.345 |
| COMPARATIVE EXAMPLE 6 | 450 | 207.5 | 77.3 | 79.2 | 5064.6 | 0.1 | 0.343 |

| | y = | R10 = | R11 = | R12 = | R13 = | R14 = | R15 = |
|---|---|---|---|---|---|---|---|
| EXAMPLE 1 | 0.350 | 56.8 | 59.7 | 38.7 | 77.8 | 91.4 | 72.3 |
| EXAMPLE 2 | 0.352 | 61.4 | 69.2 | 41.8 | 83.8 | 89.9 | 80.6 |
| EXAMPLE 3 | 0.352 | 70.9 | 78.2 | 48.9 | 86.5 | 94.1 | 79.6 |
| EXAMPLE 4 | 0.352 | 80.0 | 91.0 | 55.1 | 95.8 | 92.6 | 91.3 |
| EXAMPLE 5 | 0.351 | 71.5 | 74.5 | 49.5 | 83.6 | 95.9 | 75.7 |
| EXAMPLE 6 | 0.350 | 80.5 | 87.1 | 55.5 | 92.0 | 95.5 | 86.4 |
| EXAMPLE 7 | 0.351 | 88.6 | 68.3 | 63.3 | 85.4 | 94.0 | 74.3 |
| EXAMPLE 8 | 0.351 | 89.5 | 75.0 | 64.0 | 88.7 | 96.0 | 79.5 |
| EXAMPLE 9 | 0.351 | 35.6 | 70.0 | 32.6 | 74.2 | 81.5 | 73.6 |
| EXAMPLE 10 | 0.351 | 47.6 | 79.0 | 43.6 | 78.4 | 86.1 | 74.0 |
| EXAMPLE 11 | 0.351 | 56.6 | 82.4 | 51.2 | 87.5 | 84.8 | 85.3 |
| EXAMPLE 12 | 0.351 | 55.8 | 79.8 | 53.9 | 77.6 | 91.1 | 71.2 |
| EXAMPLE 13 | 0.351 | 65.3 | 86.7 | 62.1 | 85.8 | 90.6 | 81.6 |
| EXAMPLE 14 | 0.351 | 65.0 | 71.6 | 59.3 | 77.0 | 95.7 | 68.7 |
| EXAMPLE 15 | 0.350 | 67.7 | 78.2 | 61.7 | 80.7 | 95.3 | 73.9 |
| COMPARATIVE EXAMPLE 1 | 0.351 | 49.9 | 47.0 | 33.7 | 69.7 | 92.2 | 61.7 |
| COMPARATIVE EXAMPLE 2 | 0.352 | 59.7 | 66.9 | 40.2 | 83.5 | 88.6 | 84.4 |
| COMPARATIVE EXAMPLE 3 | 0.350 | 72.1 | 86.4 | 47.9 | 98.6 | 82.9 | 85.5 |
| COMPARATIVE EXAMPLE 4 | 0.351 | 23.1 | 51.4 | 22.2 | 60.4 | 83.9 | 55.2 |
| COMPARATIVE EXAMPLE 5 | 0.352 | 33.5 | 68.1 | 30.2 | 73.9 | 80.0 | 77.8 |
| COMPARATIVE EXAMPLE 6 | 0.350 | 43.3 | 78.8 | 37.4 | 87.8 | 74.6 | 96.1 |

TABLE 8

| | RELATIVE LED LUMINOUS INTENSITY | RELATIVE THEORETICAL LIMIT OF LUMINOUS EFFICACY | RELATIVE LED LUMINOUS INTENSITY/ RELATIVE THEORETICAL LIMIT OF LUMINOUS EFFICACY |
|---|---|---|---|
| EXAMPLE 1 | 100.0% | 100.0% | 1.00 |
| EXAMPLE 2 | 94.7% | 96.6% | 0.98 |
| EXAMPLE 3 | 96.6% | 97.6% | 0.99 |
| EXAMPLE 4 | 90.2% | 93.0% | 0.97 |
| EXAMPLE 5 | 93.4% | 98.3% | 0.95 |
| EXAMPLE 6 | 88.4% | 94.0% | 0.94 |
| EXAMPLE 7 | 89.6% | 96.4% | 0.93 |
| EXAMPLE 8 | 86.7% | 94.2% | 0.92 |
| EXAMPLE 9 | 95.0% | 96.9% | 0.98 |
| EXAMPLE 10 | 95.4% | 97.4% | 0.98 |
| EXAMPLE 11 | 90.2% | 92.9% | 0.97 |
| EXAMPLE 12 | 91.1% | 96.9% | 0.94 |
| EXAMPLE 13 | 86.2% | 92.7% | 0.93 |
| EXAMPLE 14 | 88.9% | 96.6% | 0.92 |
| EXAMPLE 15 | 85.8% | 94.3% | 0.91 |
| COMPARATIVE EXAMPLE 1 | 103.4% | 103.2% | 1.00 |
| COMPARATIVE EXAMPLE 2 | 72.0% | 87.8% | 0.82 |
| COMPARATIVE EXAMPLE 3 | 61.0% | 72.6% | 0.84 |
| COMPARATIVE EXAMPLE 4 | 103.6% | 103.4% | 1.00 |
| COMPARATIVE EXAMPLE 5 | 71.3% | 88.1% | 0.81 |
| COMPARATIVE EXAMPLE 6 | 63.0% | 74.1% | 0.85 |

Here, with reference to FIG. 31 and FIG. 32, distinctive effects of the present invention are described. According to FIG. 31 and FIG. 32, it is understood that there is a trade-off relationship that when Ra increases, the theoretical limit of luminous efficacy declines; however, it is understood that compared with the semiconductor light-emitting devices in the comparative examples shown by triangles in the figure, the semiconductor light-emitting devices in the examples shown by black dots in the figure are influenced by the trade-off remarkably slightly. This tendency is conspicuous especially in a region where Ra is 80 or more, and it is understood that the semiconductor light-emitting devices in the examples have a structure which shows remarkably high luminous efficiency in a region of practical color rendering property.

In a table 8, the theoretical limits of luminous efficacy and relative values of the LED luminous intensity of the respective light-emitting devices produced in the above examples and comparative examples are compared with each other. The LED luminous intensity shown in the table 8 is measured by means of a structure obtained by combining the MCPD-7000 and an integrating sphere under a drive condition of a voltage of 5 V, an electric current of 20 mA.

According to the table 8, it is understood that there is a strong correlation between the actual measured values of the LED luminous intensity and the theoretical limits of luminous efficacy in the examples and comparative examples. In other words, it is understood that in the structure having the high theoretical limit of luminous efficacy in the present invention, the actual LED luminous intensity also becomes high.

However, the relative LED luminous intensity/relative theoretical limit of luminous efficacy ratios in the comparative examples 2, 3, 5 and 6 are lower than in the examples. In other words, in the semiconductor light-emitting devices produced in the comparative examples 2, 3, 5 and 6, the actual measured values of the LED luminous intensity are lower than the LED luminous intensity predicted by theoretical calculation. This is because the semiconductor light-emitting devices produced in the comparative examples 2, 3, 5 and 6 in the table 8 use the red fluorescent material; the green fluorescent material absorbs the orange light, besides, the red fluorescent material also absorbs the green light and the orange light; therefore, a two-step conversion loss occurs; accordingly, the luminous efficiency of the light-emitting devices decline. In the meantime, in the table 8, the comparative example 1 and the comparative example 4 are higher than the examples in LED luminous intensity; however, as shown in the table 7, the comparative example 1 and the comparative example 4 have Ra of 70 or smaller and R9 of −40 or smaller, that is, the color rendering property is remarkably low. Therefore, in the comparative example 1 and the comparative example 4, the LED luminous intensity is high, but the color rendering property is not preferable in practical use.

As described above, in the light-emitting devices shown in the examples, the cross absorption among the fluorescent materials is slight compared with the light-emitting devices shown in the comparative examples, accordingly, the luminous efficiency is high. This tendency is conspicuous especially in the examples 1 to 4 and the examples 9 to 11, and in these examples, the relative LED luminous intensity/relative theoretical limit of luminous efficacy ratio is 0.97 or more that is especially high. This is because the green fluorescent materials used in the examples 1 to 4 and the examples 9 to 11 are the Eu-activated β SiAlON fluorescent materials shown in the production examples 2-1 and 2-2. In the Eu-activated β SiAlON fluorescent material, the half width of the light emission spectrum is 70 nm or smaller that is narrow, accordingly, the overlapping between the absorption spectrum of the orange fluorescent material and the absorption spectrum of the green fluorescent material becomes small, whereby the cross absorption between the fluorescent materials is especially alleviated.

Besides, according to the table 3 and the table 8, it is understood that in a case where the semiconductor light-emitting devices having the same peak wavelength of the blue LED and the same orange fluorescent material are compared with each other, the semiconductor light-emitting devices using the green fluorescent material in the production example 2-2 have the highest Ra. This shows that the Eu-activated β SiAlON fluorescent material shown in the production example 2-2 has an especially preferable light emission spectrum when combined with the orange fluorescent material according to the present invention.

Comparative Examples 7 to 9

A silicone resin (product name: the KER2500, Shin-Etsu Chemical Co., Ltd.) is used, and each fluorescent material shown in a table 9 and the silicone resin are mixed and dispersed at the mass ratios shown in a table 10 to produce mold resins, and semiconductor light-emitting devices for respective comparative examples having the structure shown in FIG. 1 are produced.

In the meantime, as the semiconductor light-emitting element, an LED (product name: the EZR, Cree, Inc.) having the light emission peak wavelength at 460 nm is used, and respective ratios among the resin, the orange fluorescent material, and the green fluorescent material are suitably adjusted such that the color temperatures of the light-emitting devices approach 5000K.

Figure 33:
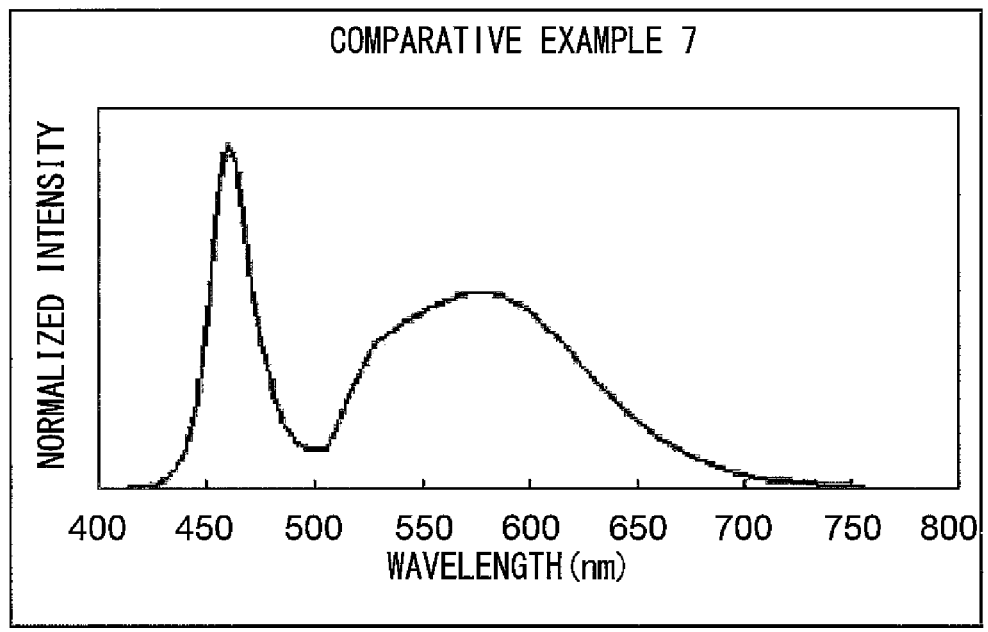
FIG. 33 is a graph showing a light emission spectrum of a light-emitting device obtained in a comparative example 7.
Figure 34:
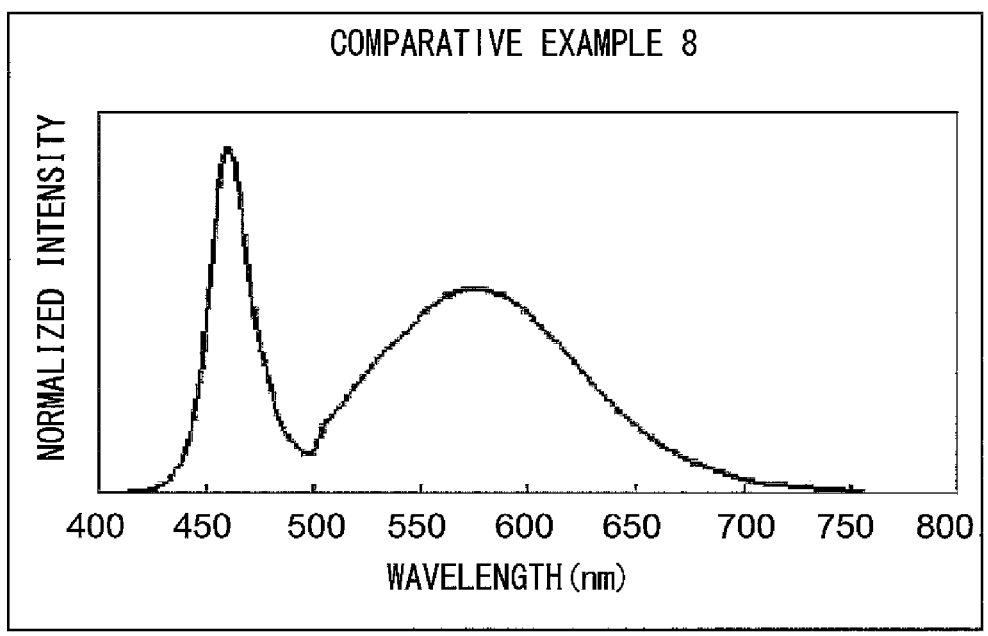
FIG. 34 is a graph showing a light emission spectrum of a light-emitting device obtained in a comparative example 8.
Figure 35:
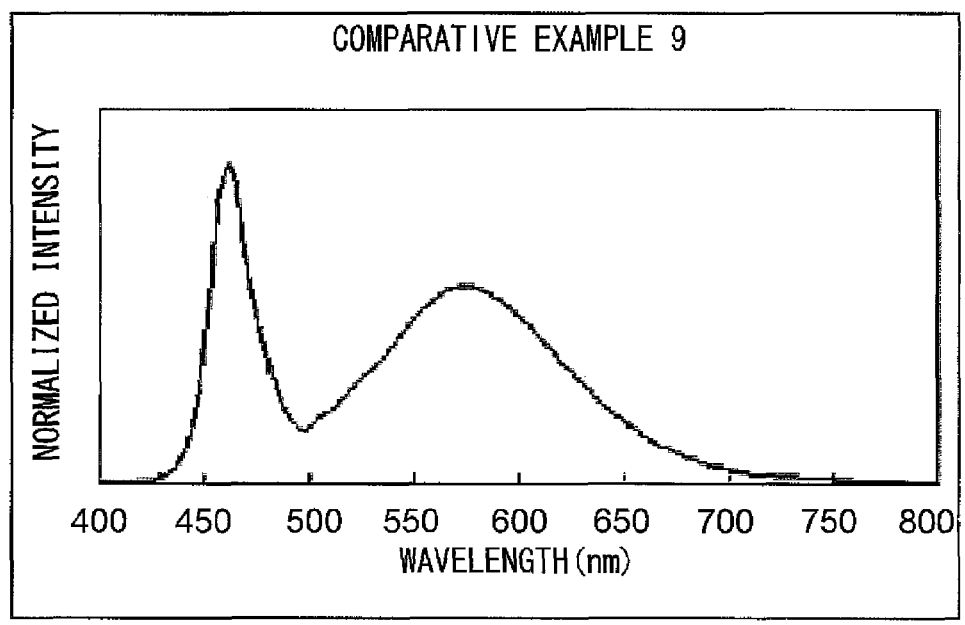
FIG. 35 is a graph showing a light emission spectrum of a light-emitting device obtained in a comparative example 9.

FIGS. 33 to 35 show respective light emission spectra of the semiconductor light-emitting devices in the comparative examples 7 to 9. In the meantime, the light emission spectra shown in FIGS. 33 to 35 are measured by using the MCPD-7000 (from Otsuka Electronics Co., Ltd.).

TABLE 9

| | BLUE LED PEAK WAVELENGTH (nm) | ORANGE FLUORESCENT MATERIAL | GREEN FLUORESCENT MATERIAL |
|---|---|---|---|
| COMPARATIVE EXAMPLE 7 | 460 | COMPARATIVE PRODUCTION EXAMPLE 1 | PRODUCTION EXAMPLE 2-2 |
| COMPARATIVE EXAMPLE 8 | 460 | COMPARATIVE PRODUCTION EXAMPLE 1 | PRODUCTION EXAMPLE 2-3 |
| COMPARATIVE EXAMPLE 9 | 460 | COMPARATIVE PRODUCTION EXAMPLE 1 | PRODUCTION EXAMPLE 2-4 |

TABLE 10

|  | RESIN/FLUORESCENT MATERIAL RATIO | GREEN FLUORESCENT MATERIAL/ORANGE FLUORESCENT MATERIAL RATIO |
|---|---|---|
| COMPARATIVE EXAMPLE 7 | 12.64 | 0.85 |
| COMPARATIVE EXAMPLE 8 | 11.40 | 1.08 |
| COMPARATIVE EXAMPLE 9 | 5.71 | 0.69 |

Comparative Example 10

A silicone resin (product name: the KER2500, Shin-Etsu Chemical Co., Ltd.) is used, and a commercial Ce-activated YAG fluorescent material (product name: the P46-Y3, Kasei Optonix, LTD., the light emission peak wavelength of 568 nm, the half width of 129 nm, the chromaticity coordinates (x, y)=(0.613, 0.386)) and the silicone resin are mixed and dispersed at a mass ratio of the resin/fluorescent material=11.7 to produce a mold resin, and a semiconductor light-emitting device for a comparative example 10 having the structure shown in FIG. 1 is produced.

In the meantime, as the semiconductor light-emitting element, an LED (product name: the EZR, Cree, Inc.) having a light emission peak wavelength at 460 nm is used, and the resin/fluorescent material ratio is suitably adjusted such that the chromaticity point approaches a black body locus when the color temperature of the light-emitting device is near 5000K.

Figure 36:
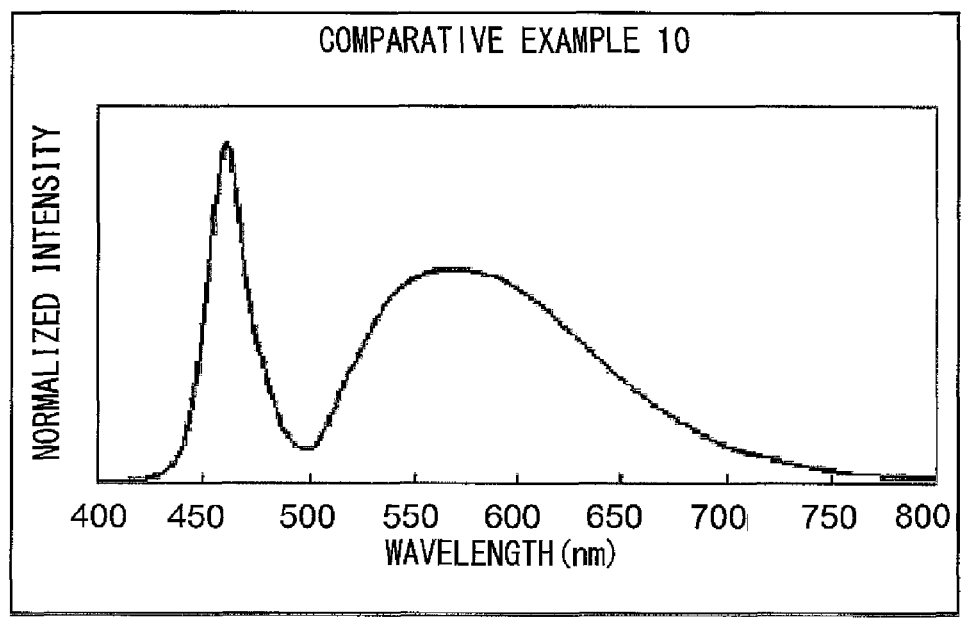
FIG. 36 is a graph showing a light emission spectrum of a light-emitting device obtained in a comparative example 10.

FIG. 36 shows a light emission spectrum of the semiconductor light-emitting device in the comparative example 10. In the meantime, the light emission spectrum shown in FIG. 36 is measured by using the MCPD-7000 (from Otsuka Electronics Co., Ltd.).

Figure 37:
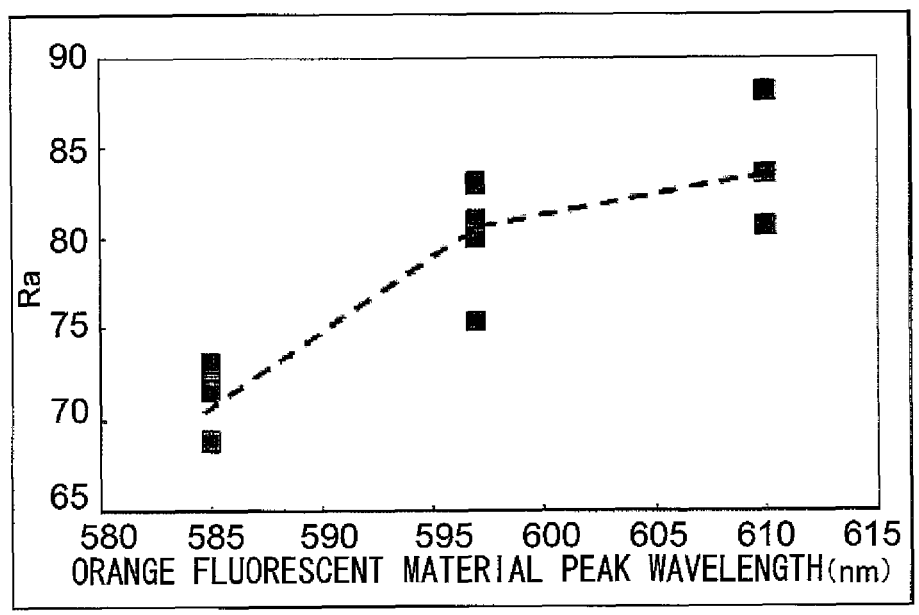
FIG. 37 is a graph showing a relationship between Ra and the light emission peak wavelength of the orange fluorescent materials of the semiconductor light-emitting devices produced in the examples 1 to 8 and produced in the comparative examples 1, 7 to 9.
Figure 38:
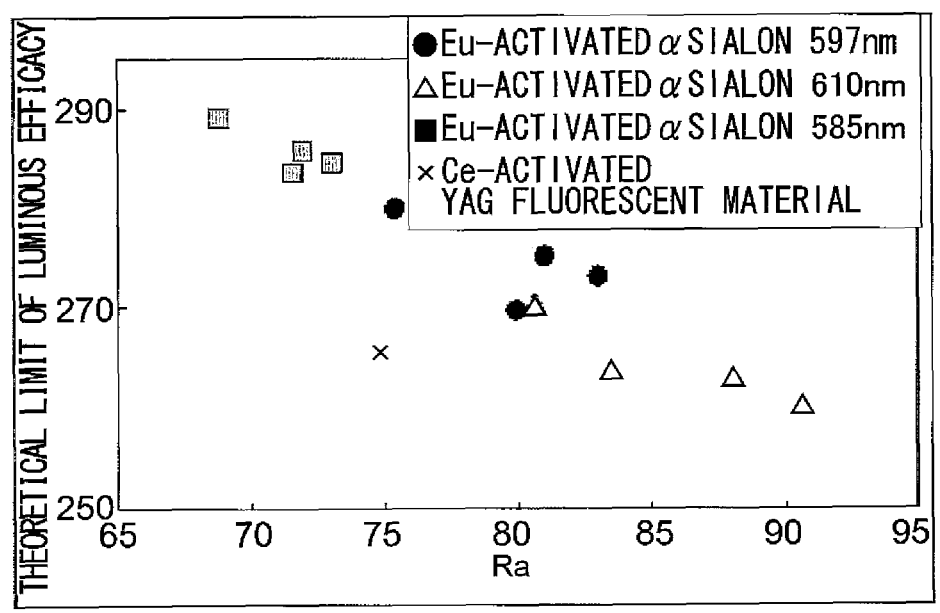
FIG. 38 is a graph showing a relationship between Ra and the theoretical limit efficiency of the semiconductor light-emitting devices produced in the examples 1 to 8 and produced in the comparative examples 1, 7 to 10.

A table 11 shows light emission properties of the respective light-emitting devices produced in the above examples and comparative examples. In the meantime, each index shown in the table 11 is calculated based on the light emission spectra in FIG. 33 to FIG. 36. FIG. 37 shows a relationship between the light emission peak wavelength and the color rendering property of the orange fluorescent materials related to the examples 1 to 8 and to the comparative examples 1, 7 to 9. Besides, FIG. 38 shows a relationship between Ra and the theoretical limit of luminous efficacy of the semiconductor light-emitting devices related to the examples 1 to 8 and comparative examples 1, 7 to 10 shown in the table 11.

TABLE 11

| | | Eu-ACTIVATED α SiAlON | | | | |
|---|---|---|---|---|---|---|
| | PRODUCTION EXAMPLE | LIGHT EMISSION SPECTRUM PEAK WAVELENGTH (nm) | THEORETICAL LIMIT OF LUMINOUS EFFICACY (lm/W) | Ra | R9 | COLOR TEMPERATURE |
| EXAMPLE 1 | PRODUCTION EXAMPLE 1-1 | 597 | 280.1 | 75.5 | −10.2 | 5021.3 |
| EXAMPLE 3 | PRODUCTION EXAMPLE 1-1 | 597 | 273.4 | 83.1 | 14.1 | 5021.1 |
| EXAMPLE 5 | PRODUCTION EXAMPLE 1-1 | 597 | 275.3 | 81.0 | 2.5 | 5058.5 |
| EXAMPLE 7 | PRODUCTION EXAMPLE 1-1 | 597 | 269.9 | 80.0 | −3.6 | 5060.4 |
| EXAMPLE 2 | PRODUCTION EXAMPLE 1-2 | 610 | 270.6 | 80.6 | 19.6 | 5011.1 |
| EXAMPLE 4 | PRODUCTION EXAMPLE 1-2 | 610 | 260.5 | 90.7 | 53.7 | 5013.9 |
| EXAMPLE 6 | PRODUCTION EXAMPLE 1-2 | 610 | 263.3 | 88.1 | 38.8 | 5048.1 |
| EXAMPLE 8 | PRODUCTION EXAMPLE 1-2 | 610 | 263.9 | 83.5 | 15.0 | 5033.0 |
| COMPARATIVE EXAMPLE 1 | COMPARATIVE PRODUCTION EXAMPLE 1 | 585 | 289.2 | 68.8 | −47 | 5036.8 |
| COMPARATIVE EXAMPLE 7 | COMPARATIVE PRODUCTION EXAMPLE 1 | 585 | 284.7 | 73.1 | −33.0 | 5065.8 |
| COMPARATIVE EXAMPLE 8 | COMPARATIVE PRODUCTION EXAMPLE 1 | 585 | 285.9 | 72.0 | −39 | 5022.7 |
| COMPARATIVE EXAMPLE 9 | COMPARATIVE PRODUCTION EXAMPLE 1 | 585 | 283.6 | 71.6 | −41 | 5042.4 |
| COMPARATIVE EXAMPLE 10 | Ce-ACTIVATED YAG FLUORESCENT MATERIAL | | 266.0 | 74.9 | −7 | 4552.2 |

| | Duv = | x = | y = | R10 = | R11 = | R12 = | R13 = | R14 = | R15 = |
|---|---|---|---|---|---|---|---|---|---|
| EXAMPLE 1 | −0.4 | 0.344 | 0.350 | 56.8 | 59.7 | 38.7 | 77.8 | 91.4 | 72.3 |
| EXAMPLE 3 | 0.2 | 0.345 | 0.352 | 70.9 | 78.2 | 48.9 | 86.5 | 94.1 | 79.6 |
| EXAMPLE 5 | 0.5 | 0.344 | 0.351 | 71.5 | 74.5 | 49.5 | 83.6 | 95.9 | 75.7 |
| EXAMPLE 7 | 0.5 | 0.344 | 0.351 | 88.6 | 68.3 | 63.3 | 85.4 | 94.0 | 74.3 |
| EXAMPLE 2 | 0.3 | 0.345 | 0.352 | 61.4 | 69.2 | 41.8 | 83.8 | 89.9 | 80.6 |
| EXAMPLE 4 | 0.1 | 0.345 | 0.352 | 80.0 | 91.0 | 55.1 | 95.8 | 92.6 | 91.3 |

TABLE 11-continued

| | | | | | | | | |
|---|---|---|---|---|---|---|---|---|
| EXAMPLE 6 | −0.1 | 0.344 | 0.350 | 80.5 | 87.1 | 55.5 | 92.0 | 95.5 | 86.4 |
| EXAMPLE 8 | 0.0 | 0.344 | 0.351 | 89.5 | 75.0 | 64.0 | 88.7 | 96.0 | 79.5 |
| COMPARATIVE EXAMPLE 1 | 0.3 | 0.344 | 0.351 | 49.9 | 47.0 | 33.7 | 69.7 | 92.2 | 61.7 |
| COMPARATIVE EXAMPLE 7 | 0.2 | 0.343 | 0.351 | 58.3 | 57.5 | 40.0 | 74.8 | 94.0 | 65.9 |
| COMPARATIVE EXAMPLE 8 | 0.1 | 0.345 | 0.351 | 59.1 | 55.6 | 40.9 | 73.3 | 94.6 | 63.8 |
| COMPARATIVE EXAMPLE 9 | 0.2 | 0.344 | 0.351 | 64.5 | 52.0 | 44.5 | 73.7 | 95.2 | 63.2 |
| COMPARATIVE EXAMPLE 10 | 0.1 | 0.359 | 0.362 | 57.0 | 57.7 | 34.5 | 76.0 | 92.5 | 70.3 |

Here, with reference to FIG. 37, a peak wavelength range of the orange fluorescent material in the present invention is described. According to FIG. 37, it is understood that Ra improves as the peak wavelength of the orange fluorescent material becomes longer, and Ra improves sharply especially at wavelengths of 595 nm or longer. In other words, as to the peak wavelength of the orange fluorescent material used in the light-emitting device, it is shown that there is an inflection point at 595 nm where the color rendering property improves sharply.

Next, with reference to FIG. 38, a peak wavelength range of the orange fluorescent material in the present invention preferable in practical use is described. According to FIG. 38, Ra of the light-emitting devices, in which the light emission peak wavelength of the orange fluorescent material is 595 nm or smaller, deteriorates compared with the semiconductor light-emitting devices that use the Ce-activated YAG only. As described above, the light-emitting device obtained by combining the Ce-activated YAG only with the semiconductor light-emitting device does not have sufficient color rendering property for general illumination. In other words, the light-emitting devices, in which the light emission peak wavelength of the orange fluorescent material is 595 nm or smaller, do not have the color rendering property sufficient in practical use. In contrast, the light-emitting devices, in which the light emission peak wavelength of the orange fluorescent material is 595 nm or more, have the color rendering property higher than the Ce-activated YAG, further, the theoretical limit of luminous efficacy also is higher than the light-emitting devices that use the Ce-activated YAG. Therefore, in the light-emitting device shown in the present example, the luminous efficiency and the color rendering property are higher than the conventional combination, and the light-emitting device is highly practical.

Further, when the light emission peak wavelength of the orange fluorescent material becomes 605 nm or more, the light-emitting device satisfies Ra>80 at the substantially same theoretical limit efficiency as the light-emitting device that uses the Ce-activated YAG fluorescent material, accordingly, satisfies the JIS standards for the above illumination, and further preferable in practical use as the light-emitting device that has the high luminous efficiency. In addition, R9 is not especially defined in the JIS standards and the like; however, by using the orange fluorescent material of 595 nm or more, R9>0 is obtained, which is a preferable feature in practical use. As described above, if R9 has a negative value such as −5 or smaller and the like, the recolor looks insufficiently, accordingly, in a case of being used in home illumination devices and the like, for example, disadvantages that human skin colors look unnaturally and the like occur.

INDUSTRIAL APPLICABILITY

The semiconductor light-emitting device according to the present invention is high in luminous efficiency and emits white light that shows high Ra and R9. Because of this, the semiconductor light-emitting device according to the present invention is usable in various illumination devices such as a home illumination device, a vehicle illumination device and the like.

REFERENCE SIGNS LIST 1 semiconductor light-emitting device
2 semiconductor light-emitting element
3 printed wiring board
4 resin frame
5 mold resin
6 InGaN layer
7 p side electrode
8 n side electrode
9 n electrode portion
10 adhesive
11 p electrode portion
12 metal wire
13 orange fluorescent material
14 green fluorescent material

The invention claimed is:
1. A lighting device comprising:
a semiconductor light-emitting element for emitting a blue light having a peak wavelength in a range of 420 to 480 nm; and
a fluorescent material retainer including:
a first fluorescent material composed of cerium, lutetium, aluminum and oxygen, for absorbing the blue light to emit a light having a first peak wavelength in a range of 500 to 550 nm, and
a second fluorescent material which is a Eu-activated α SiAlON fluorescent material and which is composed of europium, calcium, silicon, aluminum, oxygen and nitrogen, for absorbing the blue light to emit a light having a second peak wavelength in a range of 595 to 620 nm, wherein
the first fluorescent material is a green fluorescent material and the second fluorescent material is an orange fluorescent material.
2. The lighting device of claim 1, wherein
the second peak wavelength is 597 nm.
3. The lighting device of claim 1, wherein
the first and second fluorescent materials are dispersed in the fluorescent material retainer.
4. The lighting device of claim 1, wherein
a particle of the second fluorescent material has a diameter that is at most 20 μm.

5. The lighting device of claim 4, wherein a particle of the first fluorescent material has a diameter that is at most 20 μm.

6. The lighting device of claim 1, wherein the first fluorescent material is Ce activated $Lu_3Al_5O_{12}$.

7. The lighting device of claim 1, wherein a ratio of the first fluorescent material and the second fluorescent material is adjusted such that a color temperature of a light emitted from the lighting device is about 5000K.

8. The lighting device of claim 1, wherein the second peak wavelength is in a range of 605 to 620 nm.

* * * * *